United States Patent
Kawahara et al.

(10) Patent No.: US 6,541,848 B2
(45) Date of Patent: *Apr. 1, 2003

(54) SEMICONDUCTOR DEVICE INCLUDING STUD BUMPS AS EXTERNAL CONNECTION TERMINALS

(75) Inventors: Toshimi Kawahara, Kawasaki (JP); Mamoru Suwa, Kawasaki (JP); Masanori Onodera, Kawasaki (JP); Syuichi Monma, Kawasaki (JP); Shinya Nakaseko, Kawasaki (JP); Takashi Hozumi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/170,260

(22) Filed: Oct. 13, 1998

(65) Prior Publication Data

US 2002/0105069 A1 Aug. 8, 2002

(30) Foreign Application Priority Data

Feb. 25, 1998 (JP) .............................. 10-043993
Jul. 7, 1998 (JP) .............................. 10-192011

(51) Int. Cl.⁷ .................. H01L 23/48; H01L 23/52
(52) U.S. Cl. .................. 257/690; 257/738; 257/778; 257/781
(58) Field of Search ................. 257/690, 693, 257/711, 737, 738, 778, 780, 781

(56) References Cited

U.S. PATENT DOCUMENTS

| | | | |
|---|---|---|---|
| 5,157,480 A | * | 10/1992 | McShane et al. ........... 257/693 |
| 5,496,775 A | * | 3/1996 | Brooks ........................ 438/127 |
| 5,602,059 A | * | 2/1997 | Horiuchi et al. .............. 438/15 |
| 5,666,008 A | * | 9/1997 | Tomita et al. ............... 257/678 |
| 5,668,405 A | * | 9/1997 | Yamashita ................... 257/668 |
| 5,714,803 A | * | 2/1998 | Queyssac .................... 257/738 |
| 5,739,585 A | * | 4/1998 | Akram et al. ................ 257/698 |
| 5,883,432 A | * | 3/1999 | Higashiguchi ............... 257/727 |
| 5,969,461 A | * | 10/1999 | Anderson et al. ........ 310/313 R |
| 6,046,499 A | * | 4/2000 | Yano et al. .................. 257/712 |
| 6,064,114 A | * | 5/2000 | Higgins, III ................. 257/698 |
| 6,072,239 A | * | 6/2000 | Yoneda et al. ............... 257/730 |
| 6,150,717 A | * | 11/2000 | Wood et al. ................. 257/738 |
| 6,342,726 B2 | * | 1/2002 | Miyazaki et al. ............ 257/668 |

FOREIGN PATENT DOCUMENTS

| | | | |
|---|---|---|---|
| JP | 62-150749 | | 7/1987 |
| JP | 62-216347 | | 9/1987 |
| JP | 06124953 A | | 5/1994 |
| JP | 07193099 A | | 7/1995 |
| JP | 7-307409 A | * | 11/1995 |
| JP | 8-88249 | | 4/1996 |
| JP | 09134982 A | | 5/1997 |
| JP | 10-116935 A | * | 5/1998 |

* cited by examiner

*Primary Examiner*—Amir Zarabian
*Assistant Examiner*—Jamie L. Brophy
(74) *Attorney, Agent, or Firm*—Armstrong, Westerman & Hattori, LLP

(57) ABSTRACT

A semiconductor device includes a semiconductor chip, a resin package for sealing said semiconductor chip, metal layers provided on a mounting-side surface of said resin package in an exposed manner and connecting members for electrically connecting electrode pads provided on the semiconductor chip and the metal layers. The metal layers are provided with stud bumps on the mounting side, the stud bumps serving as external connection terminals.

9 Claims, 31 Drawing Sheets

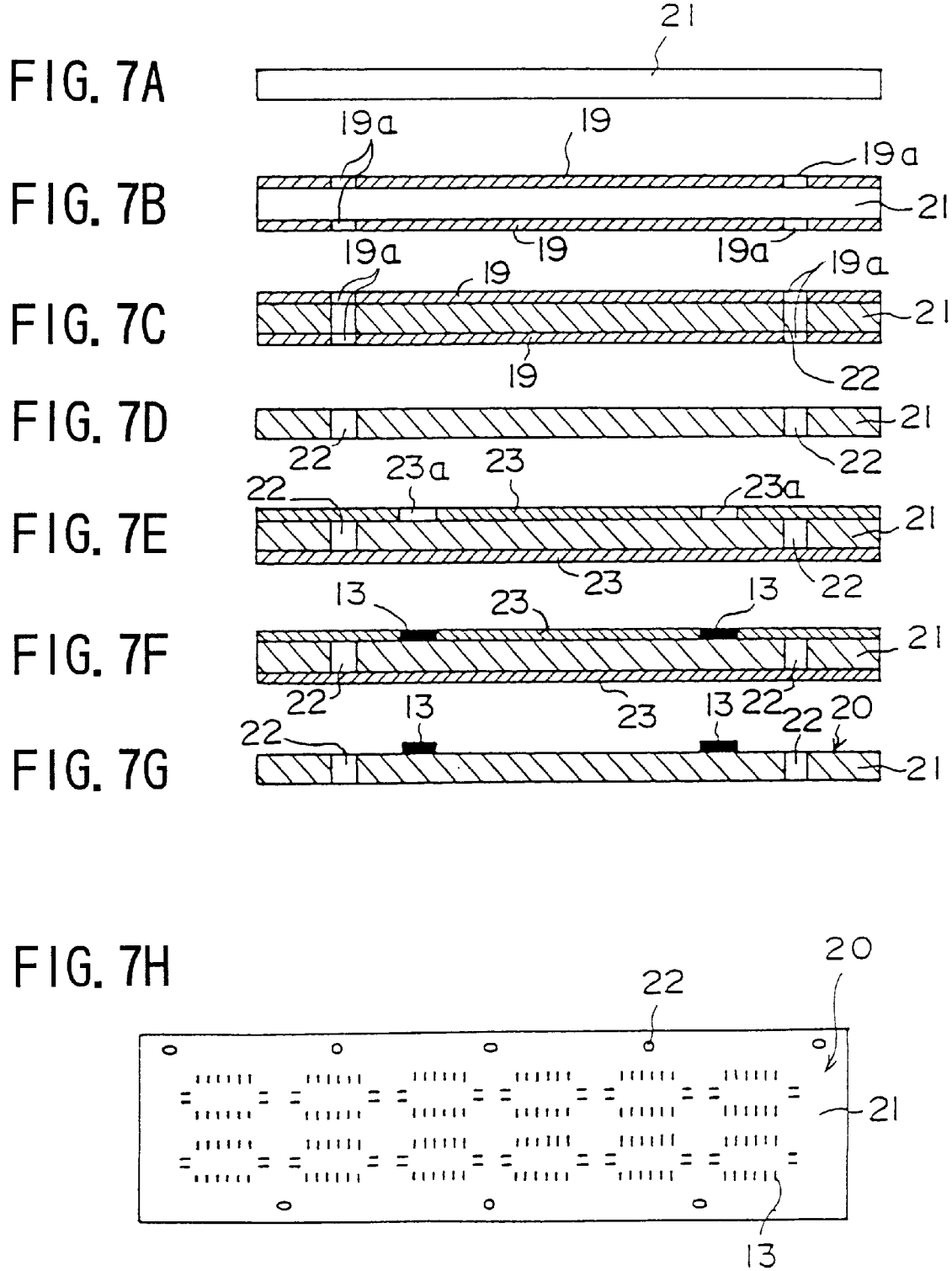

ETCHANT

ETCHANT

US 6,541,848 B2

SEMICONDUCTOR DEVICE INCLUDING STUD BUMPS AS EXTERNAL CONNECTION TERMINALS

BACKGROUND OF THE INVENTION

1. Field of the Invention

The present invention generally relates to a semiconductor device, a method of manufacturing a semiconductor device and a method of manufacturing a lead frame, and particularly relates to a semiconductor device having high-density external-connection electrodes, a method of manufacturing such a semiconductor device and a method of manufacturing a lead frame.

Recently, there is a need for semiconductor devices having smaller mounting areas on supporting boards so as to realize miniaturization of electronic devices. Also, there is a need for fine-pitched semiconductor devices in respect to the pitches of electrodes and of external connection terminals.

2. Description of the Related Art

FIGS. 1A to 1C and FIG. 2 are diagrams showing resin-seal type semiconductor devices of the related art.

Referring to FIGS. 1A to 1C, a first resin-seal type semiconductor device includes a resin 1, a semiconductor chip 2, outer leads 3, bonding wires 4 and a die pad 5. This semiconductor device has a package structure called SSOP (Shrink Small Outline Package) and is mounted on a supporting board with the outer leads 3 bent in a gull-wing shape.

Referring to FIG. 2, a second resin-seal type semiconductor device is provided with the resin 1, the semiconductor chip 2, the bonding wires 4, solder balls 6 and a semiconductor chip mounting board 7 whereon the semiconductor chip 2 is mounted. This semiconductor device has a package structure called BGA (Ball Grid Array), and terminal parts mounted on the mounting board are formed of solder balls 6.

With the semiconductor device of the SSOP type as shown in FIGS. 1A to 1C, there is a problem that the mounting area becomes large. This is because a connection part 9 between inner leads 8 in the resin 1 and the outer leads 3, and the outer leads 3 both occupy comparatively large areas. Also, with the semiconductor device of the BGA type shown in FIG. 2, there is a problem of additional cost since the device requires the mounting board 7.

In order to provide a semiconductor device which can solve the above-described problems, the applicant has proposed Japanese Laid-Open Patent Application 9-162348. FIG. 3 shows a semiconductor device 110 related to the cited application.

The semiconductor device 110 shown in FIG. 3 has a package structure called BCC (Bump Chip Carrier) and has an extremely simple structure including a semiconductor chip 111, a resin package 112 and metal layers 113. The metal layers 113 are deposited on resin protrusions 117 integrally formed on a mounting surface 116 of the resin package 12. The semiconductor chip 111 is connected to the metal layers 113 by wires 118. Also, stud bumps 119 are provided so as to improve connectivity between the wires 118 and the metal layers 113.

The semiconductor device 110 having the above structure no longer requires inner leads and outer leads as those of the SSOP type of the related art. Therefore, no area is required for the connection part between the inner leads and the outer leads and for the outer leads. Thus, the semiconductor device 110 can be miniaturized.

Also, a mounting board as used in the BGA type of the related art is no longer required since there is no need for supporting the solder balls thereon. Therefore, the cost of manufacturing the semiconductor device 110 can be lowered. Further, the resin protrusions 117 and the metal layers 113 cooperate so as to provide a function equivalent to that of the solder bumps of the semiconductor device of the BGA type. Thus, a mounting ability can be improved.

However, problems may arise when attempting to provide fine-pitched external connection terminals having a terminal pitch size of, for example, less than 0.5 mm so as to meet the recent trend of ever miniaturized and fine-pitched semiconductor devices. With the semiconductor device 110 of the BCC structure shown in FIG. 3, the external connection terminals are formed of the resin protrusions 117 and the metal layers 113. Thus, it is difficult to achieve a fine-pitched structure in regards to creating half-etched recesses of the lead frame during manufacturing processes of the semiconductor device and to creating the metal layers 113. In other words, there is a limit in reducing the mounting area. Therefore, there is still a need for further reduction in the mounting area.

Also, with the semiconductor device of the BGA structure shown in FIG. 2, a fine-pitched structure of the semiconductor device implies finer solder balls 6. It is then difficult to mount such fine solder balls 6 on the semiconductor mounting board 7 with high accuracy.

Accordingly, there is a need for a resin-seal type semiconductor device having fine-pitched mounting terminals and a small mounting area, while achieving reduction in its cost and size. Also, there is a need for a method of manufacturing such a semiconductor device. Further, there is a need for manufacturing a lead frame.

SUMMARY OF THE INVENTION

Accordingly, it is a general object of the present invention to provide a semiconductor device, a method of manufacturing a semiconductor device and a method of manufacturing a lead frame which can satisfy the needs described above.

It is another and more specific object of the present invention to provide a semiconductor device which can achieve a fine-pitched structure of external connection terminals.

In order to achieve the above objects according to the present invention, a semiconductor device includes a semiconductor chip sealed in a resin and connecting members for electrically connecting the semiconductor chip and external connection terminals, wherein the external connection terminals are stud bumps.

In the semiconductor device described above, when wires are used as the connecting members, stud bumps can be formed with the same equipment as used in a wire bonding process, since a wire bonder is used for forming the stud bumps. Therefore, an equipment cost can be reduced.

It is still another object of the present invention to provide a semiconductor device which can achieve a fine-pitched structure of external connection terminals and also a low-back structure of the semiconductor device.

In order to achieve the above object, a semiconductor device includes a semiconductor chip, a resin package for sealing the semiconductor chip, metal layers provided on a mounting-side surface of the resin package in an exposed manner and connecting members for electrically connecting electrode pads provided on the semiconductor chip and the metal layers. The metal layers are provided with stud bumps on the mounting side, the stud bumps serving as external connection terminals.

It is yet another object of the present invention to provide a semiconductor device which can achieve good electrical connectivity between the semiconductor chip and metal layers, and between the metal layers and the mounting board.

In order to achieve the above object, each of the metal layers has a single-layered structure and is made of one of gold (Au), palladium (Pd) and aluminum (Al). Other embodiments are also possible. Each of the metal layers may have a double-layered structure having two layers each made of respective one of gold (Au), palladium (Pd) and aluminum (Al). Each of the metal layers may have a double-layered structure having an outer layer made of palladium (Pd) and an inner layer made of nickel (Ni). Also, each of the metal layers may have a triple-layered structure having three layers made of either a combination of an outer layer made of palladium (Pd), an intermediate layer made of nickel (Ni) and an inner layer made of palladium (Pd), or a combination of an outer layer made of gold (Au), an intermediate layer made of nickel (Ni) and an inner layer made of palladium (Pd). Further, each of the metal layers may have a quadruple-layered structure having four layers made of a combination of an outer layer made of palladium (Pd), a first intermediate layer made of nickel (Ni), a second intermediate layer made of palladium (Pd) and an inner layer made of gold (Au).

It is yet another object of the present invention to provide a semiconductor device which can achieve a further high-density structure of the external connection terminals.

In order to achieve the above object, a semiconductor device includes a semiconductor chip, a resin package for sealing the semiconductor chip and connecting members having one set of ends connected to electrode pads on the semiconductor chip and the other set of ends exposed from the resin package as to form mounting-side ends, wherein the mounting-side ends exposed from the resin package are provided with stud bumps, the stud bumps serving as external connection terminals.

It is yet another object of the present invention to provide a semiconductor device which can provide the wires efficiently and at a low cost.

In order to achieve the above object, connecting members are wires. Therefore, a wire bonding equipment can be used which is commonly used as equipment for manufacturing semiconductor devices.

It is yet another object of the present invention to provide a semiconductor device which can achieve a low-back structure of wire loops so as to reduce the thickness of the semiconductor device.

In order to achieve the above object, the wires extend from the stud bumps and terminate at electrode pads on the semiconductor chip. A joining area against the stud bump will be greater since an end of the wire which is joined to the stud bump becomes the first bonding side. Therefore, a joining ability between the stud bumps and the wires is improved.

It is yet another object of the present invention to provide a semiconductor device which can prevent bad connections of the stud bumps and improve the reliability of the semiconductor device.

In order to achieve the above object, an area of a part of the connecting members exposed from the resin package is greater than a joining area of the stud bump. When automatically forming the stud bumps using the wire-bonding equipment, the stud bumps can be securely joined on the first bonding parts since slight errors of bonding positions do not affect the joining of the stud bumps and the first bonding parts.

It is yet another object of the present invention to provide a lead frame used for manufacturing the semiconductor described above, which has a simple structure.

In order to achieve the above object, the metal layers are provided at positions corresponding to positions where the stud bumps are to be provided.

It is yet another object of the present invention to provide a lead frame used for manufacturing the semiconductor described above, which can prevent the resin package from falling off from the lead frame, thus improving a yield of manufacturing the semiconductor device.

In order to achieve the above object, a recessed part is formed at a position corresponding to a position where the resin package is to be formed. Also, the lead frame can further include an intermediate metal layer provided inside the recessed part. Further, the recessed part has an area, at least at the periphery, not provided with the intermediate metal layer. Finally, the recessed part can be provided with raised parts formed therein.

It is yet another object of the present invention to provide a simple method of manufacturing the lead frame.

In order to achieve the above object, the method of manufacturing the lead frame includes the steps of:

a) forming a first resist on a base material;

b) forming a predetermined first resist pattern by removing parts of the first resist corresponding to the parts where through holes are to be formed, the through holes used for fixing or moving the base material;

c) forming through holes by etching the base material using the first resist pattern as a mask;

d) removing the first resist;

e) forming a second resist on a base material;

f) forming a predetermined second resist pattern by forming resist openings by removing parts of the second resist corresponding to the parts where metal layers are to be formed;

g) forming metal layers at the resist openings formed on the second resist; and h) removing the second resist.

It is yet another object of the present invention to provide a method of manufacturing the semiconductor device with simple manufacturing processes.

In order to achieve the above object, the method includes the steps of:

a) mounting the semiconductor chip on the lead frame, and electrically connecting the semiconductor chip and the metal layers using the connecting members;

b) sealing the semiconductor chip on the lead frame so as to form the resin package;

c) dissolving the lead frame so that the metal layers are exposed;

d) forming stud bumps on a mounting-side surface of the exposed metal layers.

Alternatively, the method can include the steps of:

a) mounting the semiconductor chip on the lead frame, and electrically connecting the semiconductor chip and the metal layers using the connecting members;

b) sealing the semiconductor chip on the lead frame so as to form the resin package;

c) dissolving the lead frame and the metal layers so that mounting-side ends of the connecting members are exposed;

d) forming stud bumps on the exposed mounting-side ends of the connecting members.

It is yet another object of the present invention to provide a method of manufacturing the semiconductor device which method can form external plating on a number of mounting-side ends provided with a fine structure.

In order to achieve the above object, the method includes the steps of:

a) mounting the semiconductor chip on the lead frame, and electrically connecting the semiconductor chip and the metal layers using the connecting members;

b) sealing the semiconductor chip on the lead frame so as to form the resin package;

c) dissolving the lead frame and the metal layers so that mounting-side ends of the connecting members are exposed;

d) forming external plating on the exposed mounting-side ends of the connecting members.

It is yet another object of the present invention to provide a method of manufacturing the semiconductor described above, which can prevent the resin package from falling off from the lead frame, thus improving a yield of manufacturing the semiconductor device.

In order to achieve the above object, the method includes the steps of:

a) mounting the semiconductor chip in the recessed part formed in the lead frame, and forming connecting members having one set of ends connected to electrode pads on the semiconductor chip and the other set of ends exposed from the resin package so as to form mounting-side ends;

b) sealing the semiconductor chip in the recessed part formed in the lead frame so as to form the resin package;

c) dissolving the lead frame so that the mounting-side ends of the connecting members are exposed;

d) forming stud bumps on the exposed mounting-side ends of the connecting members.

Also, the connecting members may be one of wires and protruded electrodes. When the connecting members are wires, the step a) further includes the steps of:

e) first bonding the wires on the intermediate metal layer, and f) second bonding the wires on the semiconductor chip by extending the wires.

Other objects and further features of the present invention will be apparent from the following detailed description when read in conjunction with the accompanying drawings.

BRIEF DESCRIPTION OF THE DRAWINGS

FIGS. 7A to 7H are diagrams showing a method of manufacturing a lead frame.

DETAILED DESCRIPTION OF THE PREFERRED EMBODIMENTS

In the following, principles and embodiments of the present invention will be described with reference to the accompanying drawings.

Figure 4:
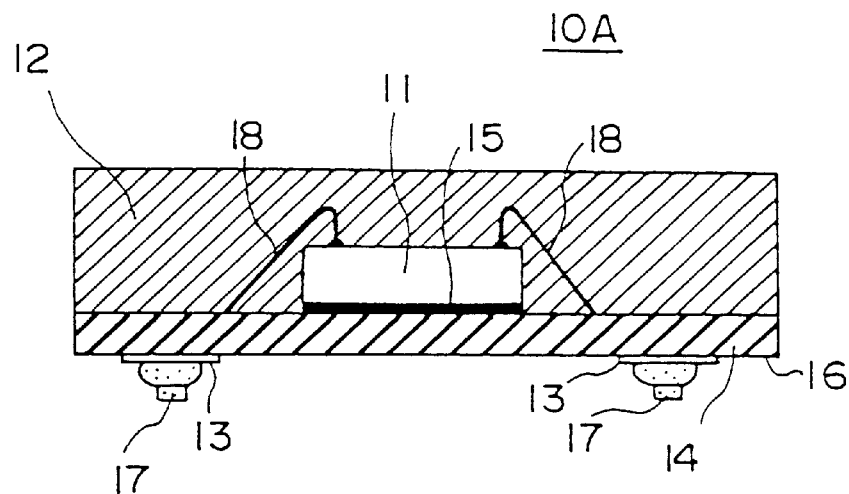
FIG. 4 is a cross-sectional diagram showing a semiconductor device of a first embodiment of the present invention.

FIG. 4 is a cross-sectional diagram showing a semiconductor device 10A according to a first embodiment of the present invention. The semiconductor device 10A has an extremely simple structure including a semiconductor chip 11, a resin package 12, metal layers 13, a semiconductor chip mounting board 14 and stud bumps 17.

The semiconductor chip 11 is provided with a plurality of electrode pads formed thereon and has a structure such that the semiconductor chip 11 is mounted on a chip fixing resin 15 provided on the semiconductor chip mounting board 14. Also, the resin package 12 is formed by, for example, molding (or potting) an epoxy resin.

The metal layers 13 are formed on a mounting-side surface 16 of the semiconductor chip mounting board 14 so as to be exposed. This semiconductor chip mounting board 14 may be provided as a multilayer printed wiring board such as a glass-epoxy board, a tape board or a ceramic board. It is also possible to use a lead frame as the semiconductor chip mounting board 14 and to use a single-layer structured board having through holes.

On an upper surface of the semiconductor chip mounting board 14, there are provided the semiconductor chip 11 and the resin package 12 for sealing the semiconductor chip 11. Also, wires 18 are provided so as to connect electrodes on the semiconductor chip 11 and bonding pads (not shown) provided on the upper surface of the semiconductor chip mounting board 14.

On the mounting-side surface 16, which is a lower surface of the semiconductor chip mounting board 14, the metal layers 13 are provided as has been described. The metal layers 13 are connected to the above-described bonding pads via internal interconnections formed inside the semiconductor chip mounting board 14. Also, the metal layers 13 have a flat shape since the metal layers 13 are provided on the mounting-side surface 16 of the semiconductor chip mounting board 14.

The stud bumps 17 are provided on the metal layers 13. These stud bumps 17 project downwards from the metal layers 13 as shown in the Figure. Thereby, it is possible to use these stud bumps 17 as external connection terminals. Also, by electrically connecting the stud bumps 17 to the metal layers 13, the stud bumps 17 will also be electrically connected to the semiconductor chip 11 via internal interconnections within the semiconductor chip mounting board 14, the bonding pads, the wires 18 and the electrode pads. That is to say, the metal layers 13, the semiconductor chip mounting board 14 and the wires 18 serve as interposers (connecting members) electrically connecting the semiconductor chip 11 and the stud bumps 17.

Figure 2:
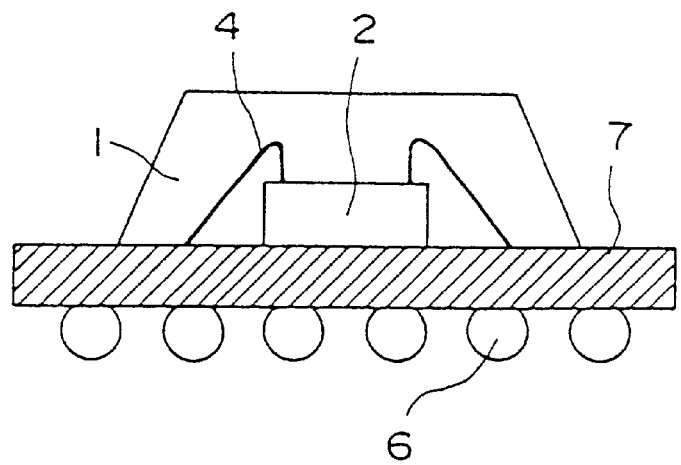
FIG. 2 is a diagram showing another example of a semiconductor device of the related art.
Figure 3:
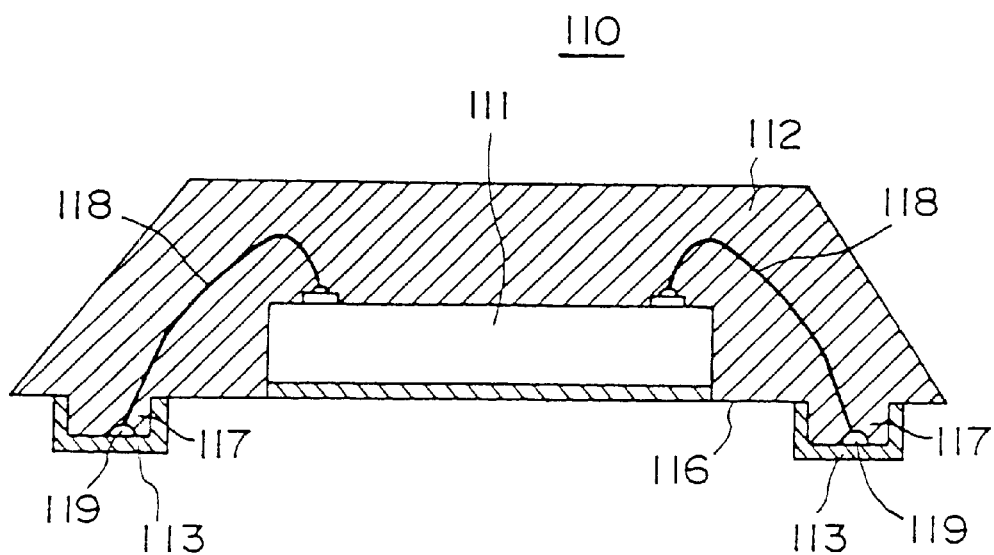
FIG. 3 is a diagram showing still another example of a semiconductor device of the related art.

As has been described, it is difficult to achieve a fine-pitched structure with pitches less than 0.5 mm with the semiconductor device of the BGA structure shown in FIG. 2 and with the semiconductor device 110 of the BCC structure shown in FIG. 3. However, with the semiconductor 10A having the above-described structure, the external connection terminals can be fine-pitched since the external connection terminals are formed by the stud bumps 17.

The stud bumps 17 are formed by bonding wires having diameters of 20–30 $\mu$m, which makes it possible to form fine external connection terminals and thereby achieve a pitch less than 0.5 mm. Accordingly, by using the stud bumps 17 as the external connection terminals, it is possible to achieve a finer pitch of the external connection terminals compared to the semiconductor devices of the BGA structure and of the BCC structure. Thereby, the semiconductor device 10A may be miniaturized while achieving a higher density and multi-pin structure of the semiconductor chip 11.

As described above, the semiconductor device 110 of the BCC structure shown in FIG. 3 is a semiconductor device having reduced size and thickness. The semiconductor device 10A of the present embodiment is not provided with the resin protrusions 117 shown in FIG. 3 with the semi-conductor device 110 of the BCC structure. Therefore, with the semiconductor device 10A of the present embodiment, it is possible to achieve a low-back structure reduced in height by a height of the resin protrusions 117 compared to the semiconductor device 110 of the BCC structure.

Also, the stud bumps 17 are formed by wire-bonding equipment. Therefore, when using wires 18 as connecting members as in the present embodiment, the stud bumps 17 may be formed by the same equipment as the equipment used in the connecting process of the wires 18. Accordingly, no separate equipment is needed for forming the stud bumps 17, so that it is possible to reduce the equipment cost as well as the product cost.

A method of manufacturing the semiconductor device 10A of the above-described structure may be implemented using a method of manufacturing the semiconductor device of the above-described BGA structure (see FIG. 2). First, the semiconductor chip 11 is mounted on the upper surface of the semiconductor chip mounting board 14. Next, the wires 18 are provided between the electrode pads of the semiconductor chip 11 and the bonding pads of the semiconductor chip mounting board 14 using the wire-bonding equipment. Subsequently, the resin package 12 is formed by molding.

For a typical semiconductor device of the BGA structure, the above processes are followed by a process of providing solder balls on the mounting-side surface 16 of the semiconductor chip mounting board 14. However, when manufacturing the semiconductor device 10A according to the present embodiment, the above processes are followed by the above-described process of providing solder balls and also a process of forming the stud bumps 17 using the wire-bonding equipment (stud-bump forming process).

Thus, the method of manufacturing the semiconductor device 10A can be implemented using the method of manufacturing the semiconductor device of the BGA structure. Also, the stud-bump forming process may be implemented using the wire-bonding equipment used for providing the wires 18. Thus, as has been described, it is possible to reduce the equipment cost as well as the product cost.

Now, a TAB (Tape Automated Bonding) technique will be considered. In TAB technique, a semiconductor chip of a bare-chip type, that is to say, not resin sealed, is flip-chip mounted on a board (film board). The semiconductor chip has protruded electrodes (bumps) formed on its mounting surface, and electrical connection is established by pressing these protruded electrodes on the pads formed on the board.

With this mounting structure, when the semiconductor device having higher density and more protrusion electrodes is provided, a pressing force exerted on the semiconductor chip has to be increased so as to properly mount individual protruded electrodes on the pads. However, when implementing a method such as flip-chip mounting where a semiconductor chip of a bare-chip type is directly pressed against the board, the board may be deformed by uneven protrusion electrodes and the semiconductor chip itself may crack when the pressing force is increased. Therefore, there is a problem that a greater pressing force cannot be applied to the semiconductor chip.

In contrast, with the semiconductor device 10A of the present embodiment, the semiconductor chip 11 is sealed by the resin package 12, so that it is possible to mount the semiconductor chip with greater pressure compared to flip-chip mounting. Accordingly, there is no need for a leveling process for leveling the height of the stud bumps as is required in flip-chip mounting.

Referring to FIGS. 6A to 6D, the metal layers 13 will be described in detail. The figures are enlarged diagrams showing one of the metal layers 13 and its proximity.

As has been described, the metal layer 13 is provided with the stud bump 17 and is formed so as to be exposed on the mounting-side surface 16 of the semiconductor chip mounting board 14. Since the metal layer 13 is formed on the mounting-side surface 16, it has a flat shape as described above.

Figure 6A:
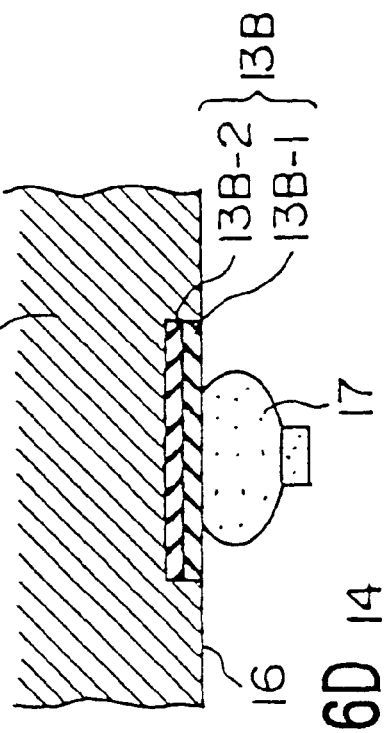
FIG. 6A is a diagram showing a metal layer having a single-layered structure.

This metal layer 13 may be formed of a single metal layer or has a structure such that a plurality of metal layers is laminated. FIG. 6A is a diagram showing a metal layer 13A formed by a single metal layer and FIGS. 6B to 6D are diagrams showing metal layers 13B to 13D formed by laminating a plurality of metal layers.

When selecting materials forming the metal layer 13 (13A to 13D), the outermost surface of the metal layer 13 is required to have a good bonding ability since the stud bump 17 will be provided thereon. When the metal layer 13 has a multilayered structure, a good joining ability is required between neighboring layers. In order to satisfy the above requirements, the metal layer 13 (13A to 13D) may be made of materials described below.

With the metal layer 13A of a single-layered structure shown in FIG. 6A, it is necessary to select a material having a good bonding ability and a good soldering ability. Materials satisfying these requirements may be, for example, gold (Au), palladium (Pd) and aluminum (Al). Therefore, the metal layer 13A may be formed by one of gold (Au), palladium (Pd) and aluminum (Al).

Figure 6B:
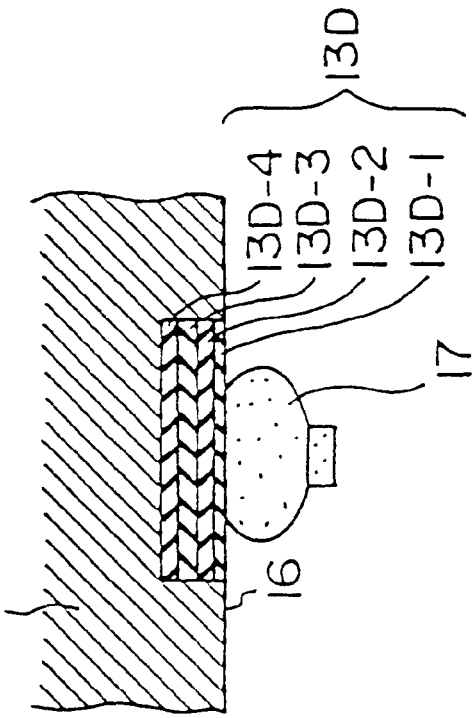
FIG. 6B is a diagram showing a metal layer having a double-layered structure.
Figure 6C:
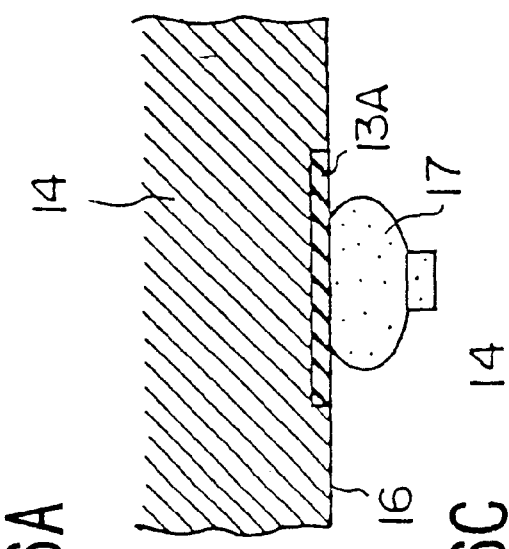
FIG. 6C is a diagram showing a metal layer having a triple-layered structure.
Figure 6D:
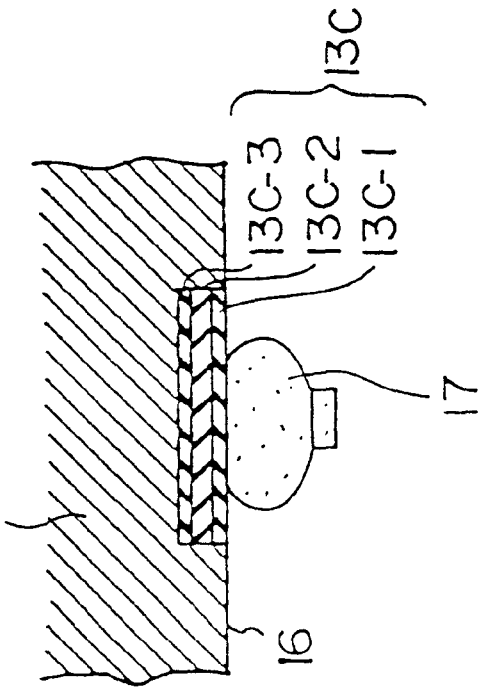
FIG. 6D is a diagram showing a metal layer having a quadruple-layered structure.

In order to satisfy the requirements, the metal layer 13B of a double-layered structure as shown in FIG. 6B may be provided as a combination of, for example, an outer layer 13B-1 made of palladium (Pd) and an inner layer 13B-2 made of nickel (Ni).

The metal layer 13C of a triple-layered structure as shown in FIG. 6C may be provided as a combination of an outer layer 13C-1 made of palladium (Pd), an intermediate layer 13C-2 made of nickel (Ni) and an inner layer 13C-3 made of palladium (Pd). Alternatively, the metal layer 13C may be provided as a combination of an outer layer 13C-1 made of gold (Au), an intermediate layer 13C-2 made of nickel (Ni) and an inner layer 13C-3 made of palladium (Pd). By providing the metal layer 13C with one of the above-described combinations, the above requirements may be satisfied while improving the joining ability of the outer layer 13C-1 and the inner layer 13C-3 by the intermediate layer 13C-2.

With the metal layer 13D of a quadruple-layered structure as shown in FIG. 6D, the metal layer 13D may be provided as a combination of an outer layer 13D-1 made of palladium (Pd), a first intermediate layer 13D-2 made of nickel (Ni), a second intermediate layer 13D-3 made of palladium (Pd) and an inner layer 13D-4 made of gold (Au). By providing the metal layer 13C with the above-described combination, the above requirements may be satisfied while improving the joining ability of the outer layer 13D-1, the first intermediate layer 13D-2, the second intermediate layer 13D-3 and the inner layer 13D-4.

In the following, a semiconductor device of a second embodiment of the present invention will be described.

Figure 5:
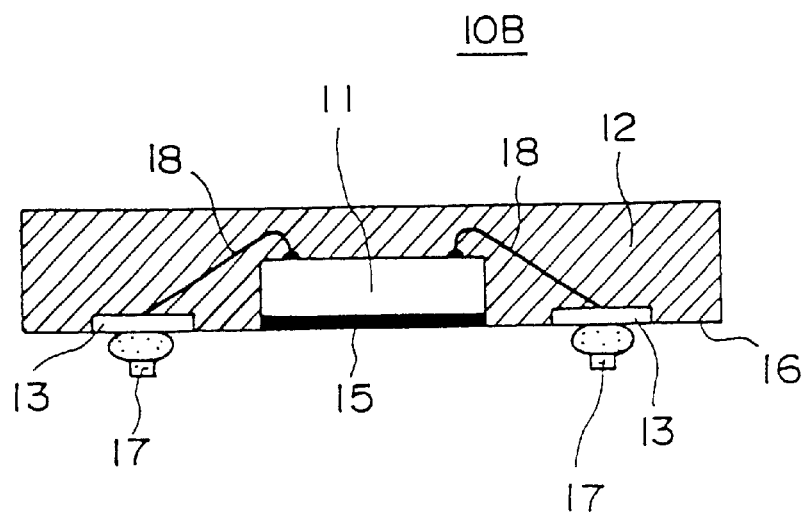
FIG. 5 is a cross-sectional diagram showing a semiconductor device of a second embodiment of the present invention.

FIG. 5 is a cross-sectional diagram showing a semiconductor device 10B of the second embodiment of the present invention. In FIG. 5, the same elements as those of the structure of the semiconductor device 10A of the first embodiment shown in FIG. 4 are shown with the same reference numbers and further description is omitted.

The semiconductor device 10A of the first embodiment is provided with the semiconductor chip mounting board 14 and has a structure such that the stud bumps 17 are provided on the metal layers 13 formed on the semiconductor chip mounting board 14.

On the contrary, the semiconductor device 10B of the present embodiment is not provided with the semiconductor chip mounting board 14 as in the semiconductor device 10A of the first embodiment. Therefore, the semiconductor device 10B is characterized in that the metal layers 13 are directly provided on the resin package 12. In other words, in the present embodiment, the metal layers 13 are formed in the mounting-side surface 16 of the resin package 12 in an exposed manner, and the stud bumps 17 serving as external connection terminals are provided on the metal layers 13.

The semiconductor device 10B of the present embodiment has a similar structure to that of the semiconductor device 110 of the BCC structure described with reference to FIG. 3. However, the semiconductor device 10B of the present embodiment differs in that it includes the stud bumps 17, serving as external connection terminals, provided on the mounting side of the metal layers 13 directly formed in the mounting-side surface 16 of the resin package 12 in an exposed manner.

Since no protrusions such as those resin protrusions 117 in FIG. 3 are formed, the semiconductor device 10B of the present embodiment can achieve a reduction in the size of the external connection terminals (stud bumps 17) compared to the semiconductor device 110 of the related art shown in FIG. 3. Therefore, external connection terminals may be of a fine-pitched structure. Also, the semiconductor device 10B may have a low-back structure compared to the semiconductor device 110 with regards to the height of the resin protrusion 117. Further, the semiconductor device 10B may have a low-back structure compared to the semiconductor device 10A of the first embodiment with regards to the height of the semiconductor chip mounting board 14.

With the semiconductor device 110 having a structure shown in FIG. 3, a bonding area of the wires 118 will be smaller since the metal layer 113 has a recessed shape. In order to give a secure wire connection, the stud bump 119 is formed on an inner side of the metal layer 113 which usually has a recessed shape, and then the wire 118 is joined to the stud bump 119. However, since a forming process for the stud bumps 119 is required with this structure, the manufacturing processes of the semiconductor device 110 become more complicated.

On the contrary, the semiconductor device 10B of the present embodiment differs from the semiconductor device 110 shown in FIG. 3 in that the metal layer 13 does not have a recessed shape, so that wire bonding on the metal layer 13 can be implemented without using a stud bump. Therefore, it is possible to simplify the structure of the semiconductor device 10B and the manufacturing processes thereof.

Now, a manufacturing method of the semiconductor device 10B of the second embodiment will be described.

The semiconductor device 10B is manufactured using a lead frame 20 shown in FIGS. 7G and 7H. This lead frame 20 has an extremely simple structure such that the metal layers 13 are provided on the upper surface of a conductive metal base material 21 at locations corresponding to locations where the stud bumps 17 will be provided. Also, the lead frame 20 is constructed such that a plurality of semiconductor devices 10B can be formed simultaneously (i.e., multiple forming). Thereby, a plurality of sets of metal layers 13 is also formed on the conductive metal base material 21.

Referring to FIGS. 7A–7H, a manufacturing process of the lead frame 20 will be described, which manufacturing process is one of the manufacturing processes of the semiconductor device 10B.

In order to manufacture the lead frame 20, the conductive metal base material 21 is prepared as shown in FIG. 7A. The metal base material 21 is provided as a flat board and may be made of copper alloy. Then, a first resist 19, which will serve as an etching resist, is coated on both sides of this metal base material 21. The first resist 19 may be a photosensitive resin and can be coated with a predetermined thickness using a spinner (first-resist forming process).

The first resist 19 is subject to exposure using a mask not shown in the Figures. Then the exposed first resist 19 is processed so as to remove portions (removed portions are indicated by 19a) corresponding to the locations of the through holes 22 of the first resist 19, thereby forming a predetermined resist pattern shown in FIG. 7B (first-resist pattern forming process).

After completion of the first-resist pattern-forming process, etching is performed on the metal base material 21 whereon the first resist 19 is formed. The metal base material 21 is etched at locations where the removed portions 19a of the first resist 19 are formed. Thus, the through holes 22 are formed as shown in FIG. 7C (etching process). When the metal base material 21 is made of copper alloy, ferric chloride may be used as an etchant.

After the etching process, the first resist 19 is removed from the metal base material 21 (first-resist removing process). As shown in FIG. 7D, the metal base material 21 is provided with the through holes 22.

After the first-resist removing process, a second resist 23, which will serve as a plating resist, is provided on both sides of the metal base material 21 having the through holes 22 (second-resist forming process). In the present embodiment, a dry film made of photosensitive resin is used as the second resist 23.

That is, when using a liquid resist, it is difficult to implement an appropriate resist forming because the resist will flow into the through holes 22. Whereas with the dry film, resist will not enter the through holes 22 even when provided on the metal base material 21 with the through holes 22.

Subsequently, the second resist 23 is exposed using a mask not shown in the Figures. Then the exposed second resist 23 is processed so as to remove portions (removed portions are referred to as mask holes 23a) corresponding to the locations of the metal layers 13, thereby forming a predetermined resist pattern shown in FIG. 7E (second-resist pattern-forming process).

After the second-resist pattern-forming process, the metal layers 13 are formed using the second resist 23 as a mask (metal-layer forming process). The metal layers 13 are formed in the mask holes 23a by implementing a plating method. FIG. 7F shows the metal base material 21 provided with the metal layers 13.

The required thickness of the metal layers 13 can be achieved by controlling the length of plating time. In the present embodiment, the plating method is used for forming the metal layers 13, but it is also possible to use layer forming techniques such as a deposition method and a sputtering method.

By implementing the above-described metal-layer forming process, the metal layers 13 are formed on the metal base material 21. Also, in the separation process, the metal layers 13 provided on the metal base material 21 will be removed from the lead frame 20 together with the resin package 12.

Accordingly, the metal layers 13 are required to have a certain separation ability from the metal base material 21.

Therefore, in order to maintain the above-described separation ability, for example, a conductive paste may be provided inside the mask holes 23a prior to forming the metal layers 13 in the mask holes 23a. Subsequently, the metal layers 13 may be provided on the conductive paste.

After the metal layers 13 have been formed in the metal-layer forming process, a second-resist removing process is implemented for removing the second resist 23. Thus, the lead frame 20 is formed, which is shown in FIGS. 7G and 7H. FIG. 7G is partial cross-sectional view of the lead frame and FIG. 7H is a plan view of the lead frame. As shown in FIG. 7H, the lead frame 20 is provided with a plurality of sets of metal layers 13, each for an individual semiconductor device, so as to enable multiple forming of the semiconductor device 10B. FIG. 7H shows an example where twelve semiconductor devices are formed simultaneously in two rows.

As described above, the lead frame 20 may be manufactured easily and with reduced process steps using conventional thin-film forming techniques, photolithography techniques, etching techniques and plating techniques. With the lead frame used for manufacturing the semiconductor device 110 shown in FIG. 3, a half-etching process is required, during a manufacturing process of the lead frame, in order to form recessed parts in the metal base material for forming the resin protrusions 117. However, this half-etching process is not necessary in the present embodiment. Thus, a manufacturing process of the semiconductor device is simplified compared to the manufacturing process of the semiconductor device 110 shown in FIG. 3.

In the following, a method of manufacturing the semiconductor device 10B will be described, which method uses the lead frame 20 manufactured by the above-described processes.

In order to manufacture the semiconductor device 10B, the chip fixing resin 15 is coated at the predetermined chip mounting location of the lead frame 20 and then the semiconductor chip 11 ht is mounted on an upper part of the chip fixing resin 15. The chip fixing resin 15 has an insulating property and also serves as an adhesive agent. Thereby, the semiconductor chip 11 will be mounted on the lead frame 20 by an adhesiveness of the chip fixing resin 15.

Subsequently, the lead frame 20 is mounted on the wire-bonding equipment. Then, the wires 18 are provided between the electrode pads formed on the semiconductor chip 11 and the metal layers 13 so that the semiconductor chip 11 and the metal layers 13 are electrically connected via the wires 18 (chip mounting process).

After the chip mounting process, the resin package 12 is formed by sealing the semiconductor chip 11 on the lead frame 20 (sealing process). In the present embodiment, the resin package 12 is formed by molding, but it is also possible to form the resin package by potting.

Figure 8:
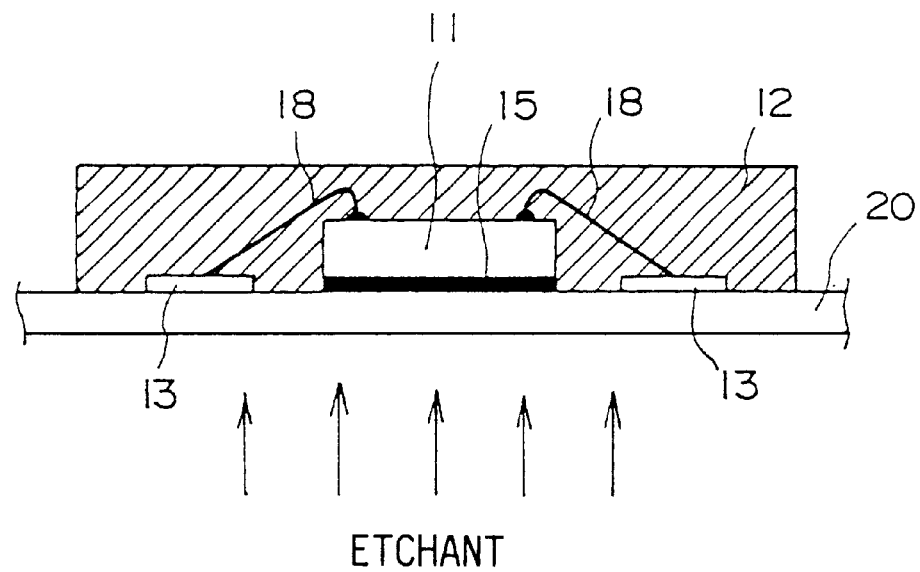
FIG. 8 is a cross-sectional diagram showing the first embodiment of the method of manufacturing a semiconductor device, particularly a dissolving process.

After the sealing process, the resin package 12 is separated from the lead frame 20 so as to provide individual semiconductor devices 10B (dissolving process). FIG. 8 is a diagram showing the dissolving process. In the example shown in FIG. 8, the resin package 12 is separated from the lead frame 20 by spraying an etchant so as to dissolve the lead frame 20.

The etchant used in the dissolving process is selected so as to have a property such that it only dissolves the lead frame 20 but not the metal layers 13. Therefore, the resin package 12 is separated from the lead frame 20 when the lead frame 20 is completely dissolved. Thus, by employing a process of dissolving the lead frame 20 in order to separate the resin package 12 from the lead frame 20, a separation process of the resin package 12 from the lead frame 20 can be implemented positively and easily. As a result, the yield will be improved.

After the dissolving process, the stud bumps 17 which serve as external terminals are formed on the mounting-side surface (exposed surface) of the metal layers 13 (stud-bump forming process).

Figure 9:
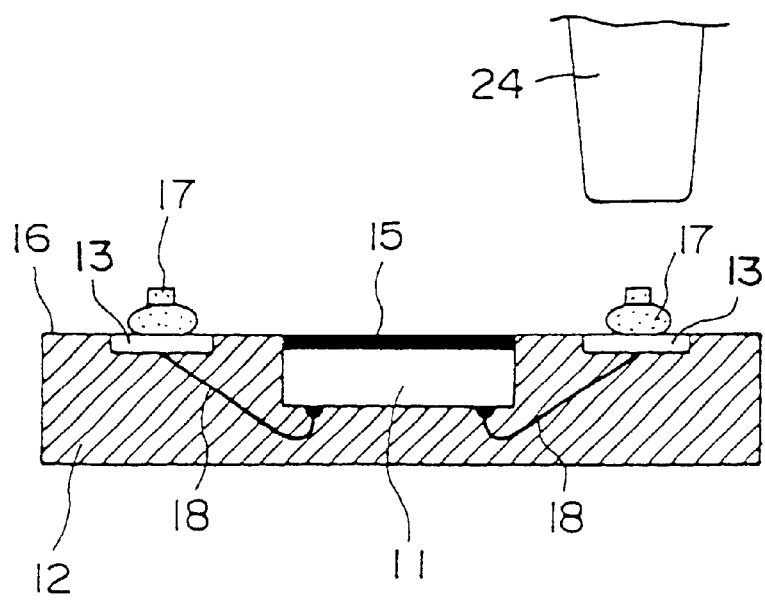
FIG. 9 is a cross-sectional diagram showing the first embodiment of the method of manufacturing a semiconductor device, particularly a stud bump forming process.

In order to form the stud bump 17, first, a ball-shaped part is formed by spark discharging a gold wire extending out in a downward direction from the tip of a capillary 24 (see FIG. 9). Then, the capillary 24 is vertically moved downwards and vibrated at an ultrasound frequency, so that the ball-shaped part is welded on the metal layer 13.

Subsequently, the capillary 24 is vertically moved upwards, so as to cut the gold wire by extending the gold wire. By implementing the above-described processes, the stud bumps 17 will be formed on the metal layers 13 as shown in FIG. 9. Also, if it is necessary to maintain a good bonding ability, a chemical treatment such as an acid treatment may be made on the mounting-side surfaces of the metal layers 13 before forming the stud bumps 17.

Figure 1:
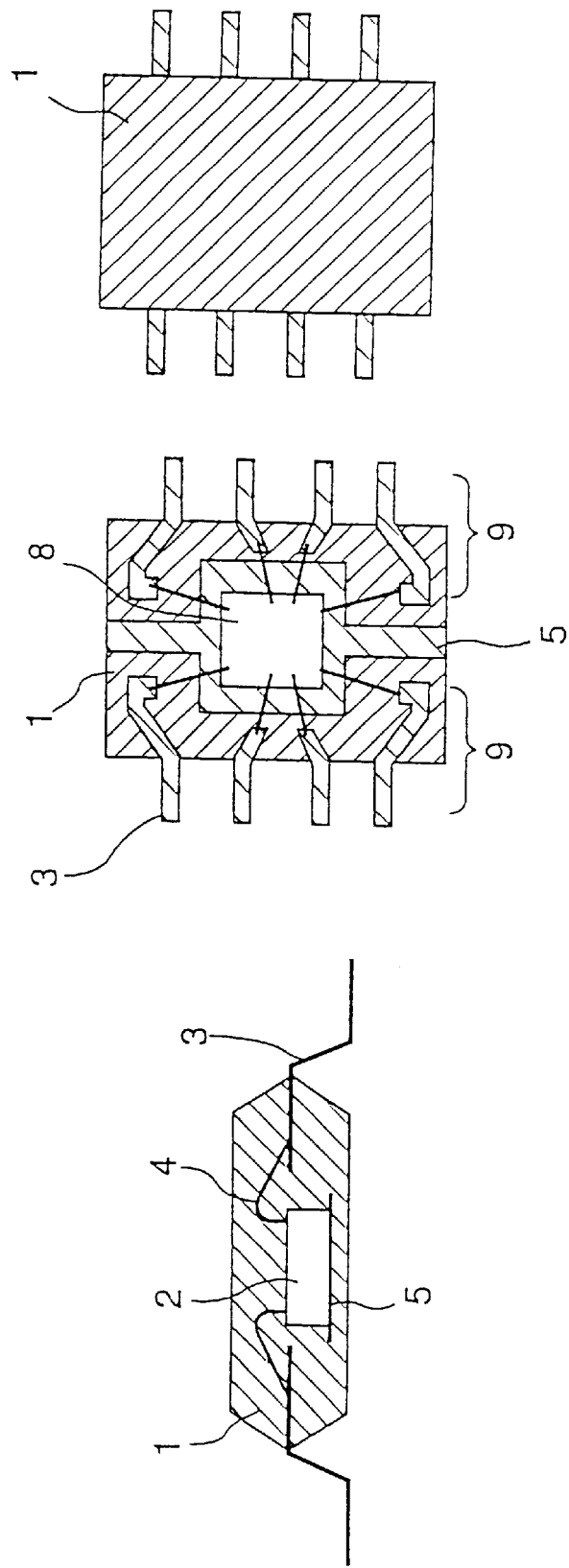
FIGS. 1A to 1C are diagrams showing an example of a semiconductor device of the related art.

Thus, the semiconductor device 10B shown in FIG. 5 is manufactured. In the manufacturing processes of the semiconductor device of the prior art shown in FIG. 1, it was necessary to cut the leads and then shape the leads into a predetermined shape (e.g., a gull-wing shape). However, such processes are not necessary in the present embodiment so that the manufacturing processes of the semiconductor device 10B are simplified compared to the related art.

Also, in the manufacturing processes of the semiconductor device of the prior art shown in FIG. 2, it was necessary to provide the solder balls 6 on the semiconductor chip mounting board 7 with high accuracy. However, because it is not necessary to implement such an accurate positioning in the present embodiment, the manufacturing processes are facilitated. In the manufacturing processes of the semiconductor device of the prior art shown in FIG. 3, it was necessary to implement a process for forming the resin protrusions 117 as described above. However, because such a resin-protrusion forming process is not necessary in the present embodiment, the manufacturing processes of the semiconductor device are simplified.

In the following, a semiconductor device of a third embodiment of the present invention will be described.

Figure 10:
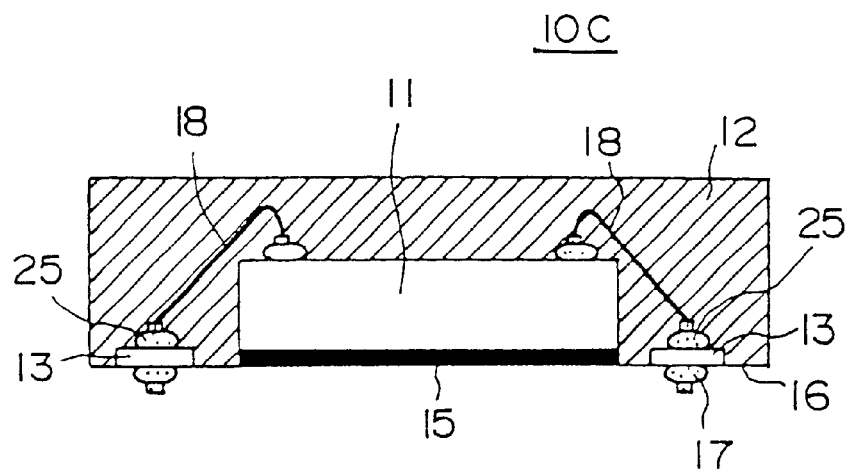
FIG. 10 is a cross-sectional diagram showing a semiconductor device of a third embodiment of the present invention.

FIG. 10 is a cross-sectional diagram showing a semiconductor device 10C of the third embodiment of the present invention. In FIG. 10, the same elements as those of the structures of the semiconductor devices 10A and 10B of the first and second embodiments shown in FIGS. 4 and 5 are shown with the same reference numbers and further description is omitted. This also applies to each of the embodiments described below.

The semiconductor device 10B of the second embodiment had a structure such that the wires 18 which serve as interposers (connecting members) were directly joined to the metal layers 13 on their the mounting-side ends. Whereas the semiconductor device 10C of the present embodiment is characterized in that the metal layers 13 are provided with internal stud bumps 25 which are embedded in the resin package 12. That is to say, in the present embodiment, the metal layers 13 are provided with the stud bumps 17 formed thereon on the mounting-side surface and also provided with the internal stud bumps 25 formed thereon on the opposite side of the mounting-side surface.

The internal stud bumps 25 are formed on the metal layers 13 using the wire-bonding equipment before providing the wires 18 in the above-described chip mounting process of the manufacturing processes of the semiconductor device 20B. Then, the wires 18 are provided on the internal stud bumps 25 (not on the metal layers 13) at their mounting-side ends, so that the semiconductor device 10C shown in FIG. 10 can be manufactured. Also, other manufacturing processes are the same as those described above.

The semiconductor device 10C of the present embodiment has a structure such that the metal layers 13 are provided with the internal stud bumps 25 formed thereon and that the internal stud bumps 25 are embedded in the resin package 12. Accordingly, the internal stud bumps 25 serve as anchors of the metal layers 13, so that the metal layers 13 are prevented from peeling off from the resin package 12.

In the following, a semiconductor device of a fourth embodiment of the present invention will be described.

Figure 11:
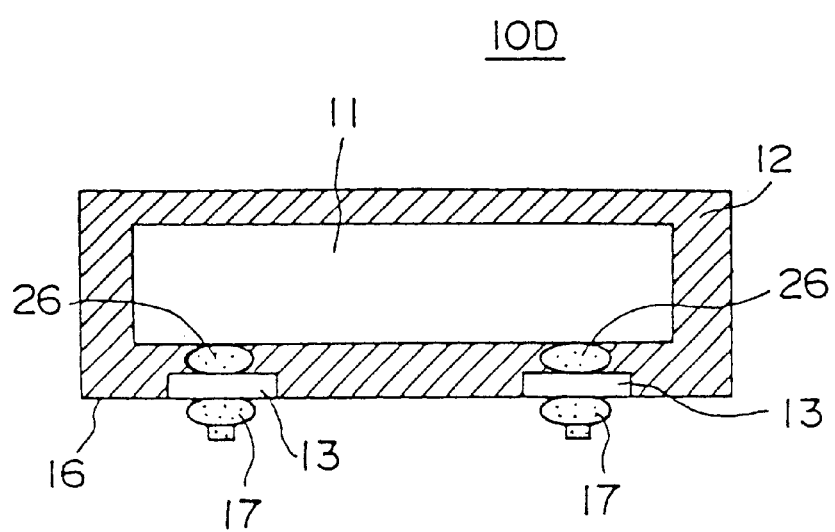
FIG. 11 is a cross-sectional diagram showing a semiconductor device of a fourth embodiment of the present invention.

FIG. 11 is a cross-sectional diagram showing a semiconductor device 10D of the fourth embodiment of the present invention. The semiconductor device 10A of the first embodiment uses the wires 18 as interposers (connecting members). However, the semiconductor device 10D of the present embodiment is characterized in that protruded electrodes 26 (e.g., solder bumps) formed on the electrode pads of the semiconductor chip 11 are used as interposers.

The semiconductor chip 11 provided with the protruded electrodes 26 is directly connected to the metal layer 13. In order to manufacture this semiconductor device 10D, the protruded electrodes 26 are pre-formed on the electrode pads on the semiconductor chip 11, and in the chip mounting process, this semiconductor chip 11 is flip-chip mounted on the metal layers 13 formed on the lead frame 20 (see FIGS. 7G and 7H). Also, other manufacturing processes are identical to those described above.

With the semiconductor device 10D of the present embodiment, the semiconductor chip 11 is flip-chip mounted on the metal layers 13 using the protruded electrodes 26, so that there is no need for the wires 18 and the space required for providing the wires. Thus, the semiconductor device 10D can be reduced in its size and thickness.

In the following, a semiconductor device of a fifth embodiment of the present invention will be described.

Figure 12:
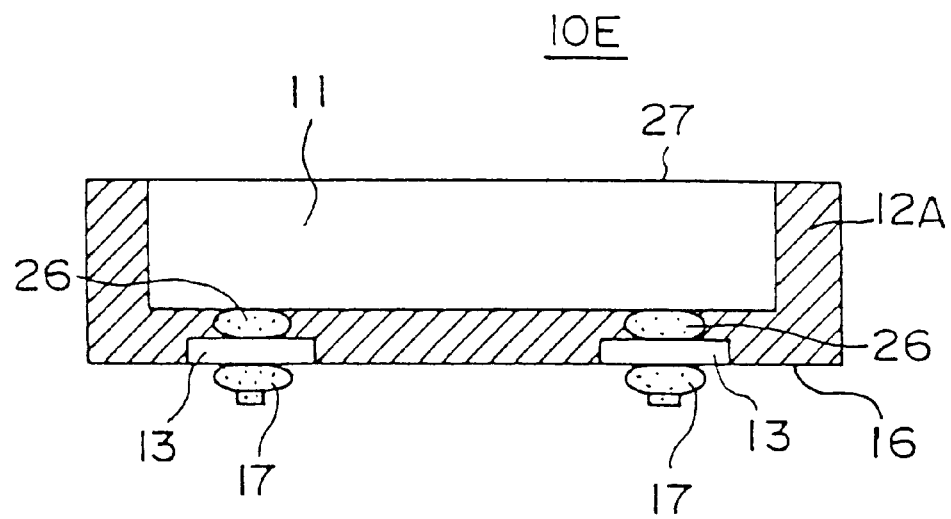
FIG. 12 is a cross-sectional diagram showing a semiconductor device of a fifth embodiment of the present invention.

FIG. 12 is a cross-sectional diagram showing a semiconductor device 10E of the fifth embodiment of the present invention. The semiconductor device 10E of the present embodiment has a structure similar to that of the semiconductor device 10D of the fourth embodiment. In the present embodiment, the resin package 12 is polished on the surface (upper surface in the figure) opposite to the mounting-side surface 16, so as to provide a polished surface 27 where the upper surface of the semiconductor chip 11 is exposed. As a result of this polishing process, part of an upper surface of the semiconductor chip 11 is also polished.

By polishing the upper surface of the resin package as in the present embodiment, it is possible to achieve a further low-back structure of the semiconductor device 10E. Also, since a part of the semiconductor chip 11 is exposed at the polishing surface 27, heat generated at the semiconductor chip 11 can be dissipated efficiently, so that a heat dissipation characteristic is improved.

In the following, a semiconductor device of a sixth embodiment of the present invention will be described.

Figure 13:
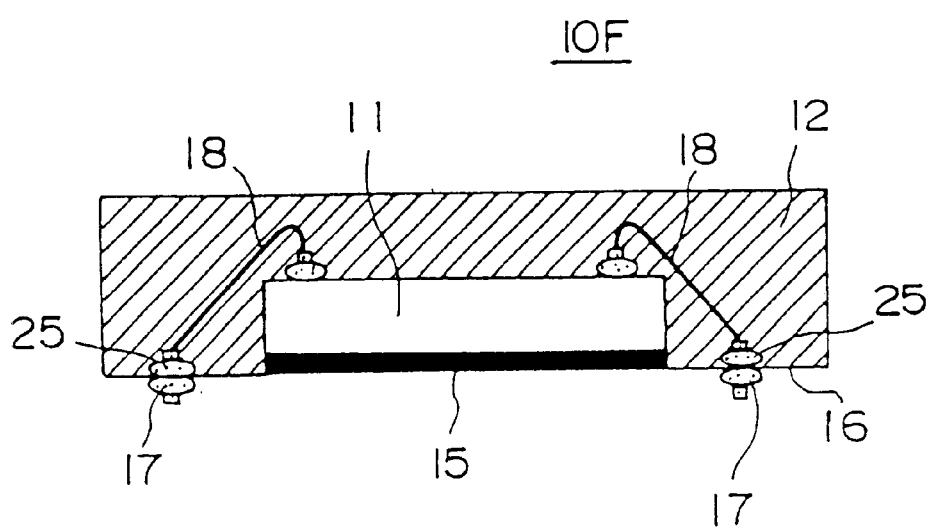
FIG. 13 is a cross-sectional diagram showing a semiconductor device of a sixth embodiment of the present invention.

FIG. 13 is a cross-sectional diagram showing a semiconductor device 10F of the sixth embodiment of the present invention.

The semiconductor device 10F of the present embodiment is characterized in that it has a structure such that the metal layers 13 are removed from the semiconductor device 10C of the third embodiment shown in FIG. 10. In other words, the stud bumps 17 which serve as external connection terminals are directly connected to the internal stud bumps 25.

According to the semiconductor device 10F of the present embodiment, since there are no metal layers 13 having greater area than the area of the stud bumps 17 and of the internal stud bumps 25, the stud bumps 17 can be provided with a further fine-pitched structure. Thereby, it is possible to achieve a higher density of the external connection terminals.

Figure 14:
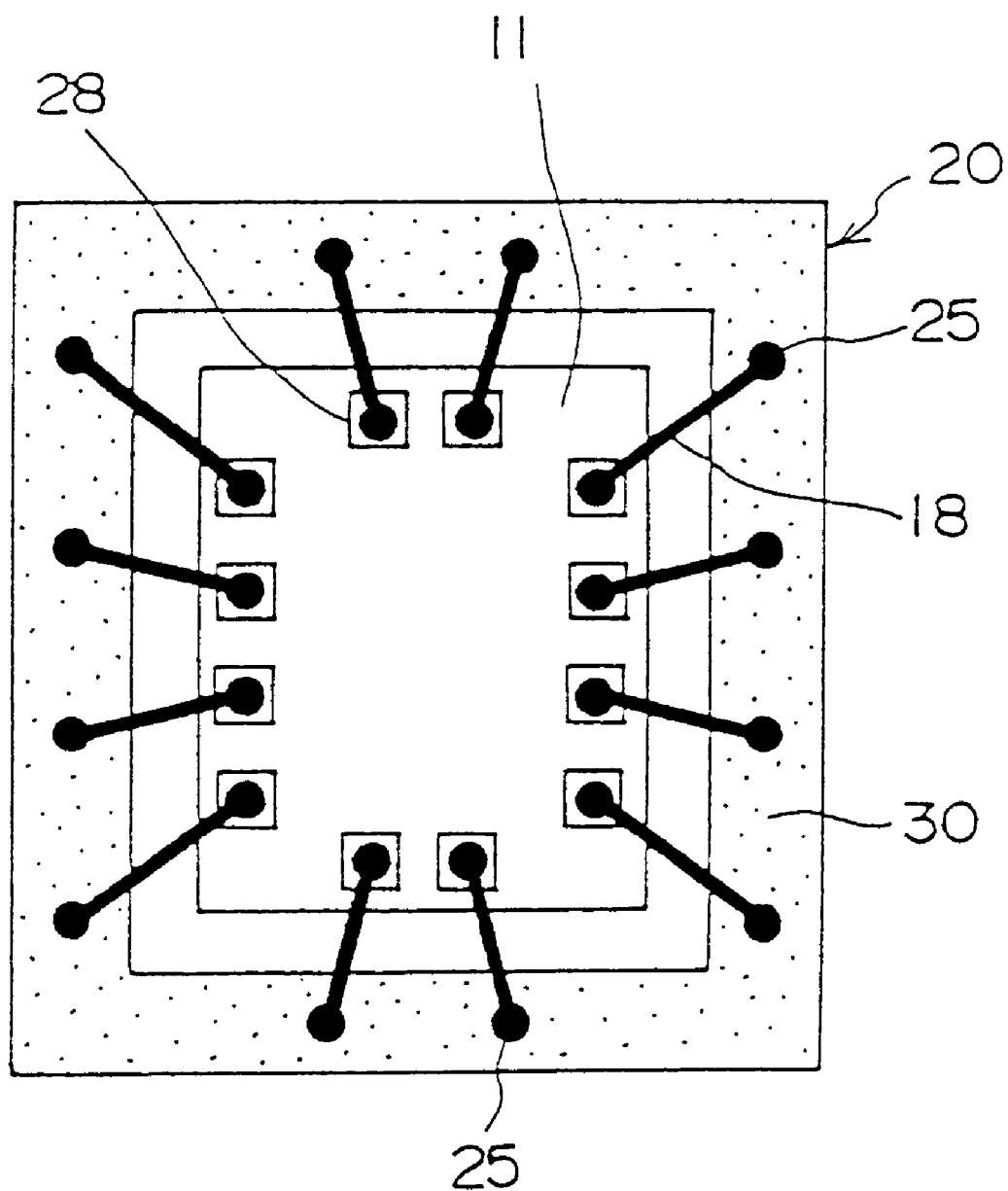
FIG. 14 is a plan view showing a second embodiment of a method of manufacturing a semiconductor device, particularly a chip mounting process.
Figure 15:
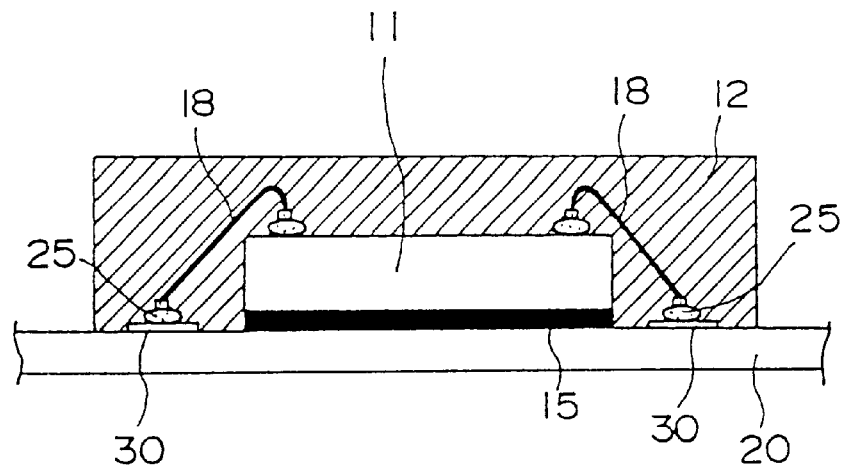
FIG. 15 is a cross-sectional diagram showing the second embodiment of the method of manufacturing a semiconductor device, particularly a chip mounting process.
Figure 16:
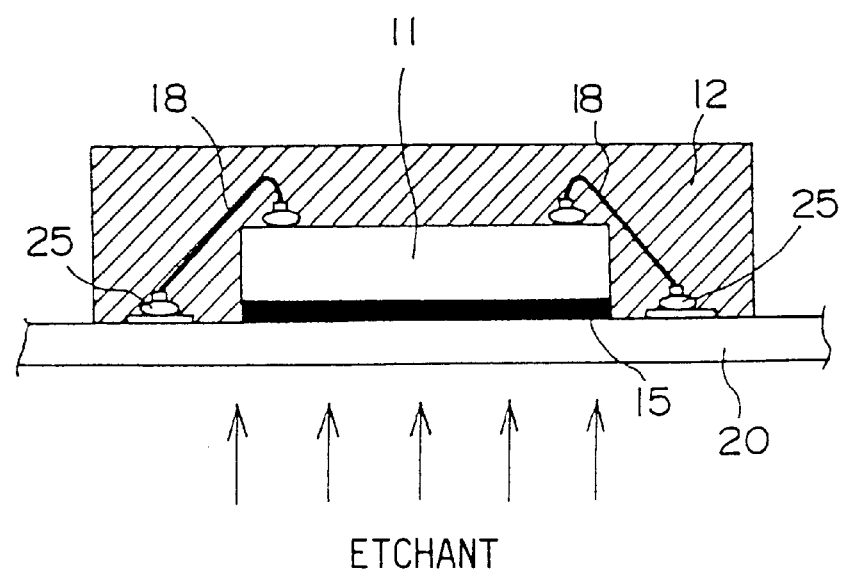
FIG. 16 is a cross-sectional diagram showing the second embodiment of the method of manufacturing a semiconductor device, particularly a dissolving process.

Referring to FIGS. 14 to 16, a method of manufacturing the semiconductor device 10F of the sixth embodiment will be described. This method may also be referred to as a second embodiment of a method of manufacturing a semiconductor device. The processes common to those of the first embodiment of the method of manufacturing the semiconductor device 10B described with reference to FIGS. 7A to 7H, 8 and 9 are not described in detail here.

FIG. 14 is plan view showing the lead frame 20 after the chip mounting process and FIG. 15 is a cross-sectional diagram showing the lead frame 20 after the sealing process.

As shown in FIG. 7H, the lead frame 20 used in the first embodiment of the method of manufacturing the semiconductor device 10B has a structure such that it is provided with the metal layers 13 formed at positions corresponding to the stud bumps 17. However, the lead frame 20 used for forming the semiconductor device 10F does not have such structure, but has a structure such that a metal layer 30 (hereinafter referred to as an intermediate metal layer 30) is formed in a ring shape so as to surround the location where the semiconductor chip 11 is provided. In the present embodiment, this intermediate metal layer 30 is made of silver (Ag).

The intermediate metal layer 30 can be easily formed by providing the mask holes 23a in a ring shape so as to surround the location where the semiconductor chip 11 is provided, when implementing the second-resist forming process and the second resist-pattern forming-process described with reference to FIG. 7E.

As described below, the semiconductor device 10F may be manufactured from the lead frame 20 whereon the intermediate metal layer 30 is formed. First, the semiconductor chip 11 is fixed at the predetermined mounting position on the lead frame 20 via the chip fixing resin 15 and the internal stud bumps 25 are formed at predetermined positions on the intermediate metal layer 30 where the stud bumps 17 will be formed. Subsequently, the wires 18 are provided between electrode pads 28 formed on the semiconductor chip 11 and the internal stud bumps 25 formed on the intermediate metal layer 30 using a wire bonder.

Since the intermediate metal layer 30 is ring-shaped, at an instance when the wires 18 are provided as shown in FIG. 14, all wires 18 and electrode pads 28 are short-circuited (connected) via the intermediate metal layer 30. The sealing process is implemented in this state so that the semiconductor chip 11, the wires 18 and the internal stud bumps 25 will be embedded in the resin package 12 as shown in FIG. 15.

After the chip mounting process and the sealing process shown in FIGS. 14 and 15, the dissolving process is implemented. FIG. 16 is a diagram used for describing the dissolving process of the present embodiment. The present embodiment is characterized in that the intermediate metal layer 30 is dissolved as well as the lead frame 20.

An etchant for dissolving both the lead frame 20 made of copper alloy and the intermediate metal layer 30 made of silver (Ag) may be, for example, an alkaline etchant of an ammonium type. When the lead frame 20 and the intermediate metal layer 30 are both dissolved, the internal stud bumps 25 will be exposed from the resin package 12. Also, individual internal stud bumps 25 will be electrically isolated.

After the dissolving process, a stud bump forming process is implemented. The stud bumps 17 serving as external connection terminals are formed on the internal stud bumps 25 exposed from the resin package 12 using the wire-bonding equipment. Thus, the semiconductor device 10F shown in FIG. 13 is manufactured by implementing a series of manufacturing processes described above.

In above-described method of manufacturing the semiconductor device 10F, the lead frame 20 and the internal metal layer 30 are both dissolved so as to expose the mounting-side part of the internal stud bumps 25 (connecting members). Therefore, the sealing resin used in the sealing process need not have good adhesiveness against the intermediate metal layer 30. Accordingly, there is an advantage that there is a wider range of choice of sealing resin compared to the semiconductor devices 10A and 10B shown in FIG. 4 and FIG. 5.

Also, since the intermediate metal layer 30 is dissolved in the dissolving process, it is not necessary to implement an accurate patterning of the metal layers 13 against the stud bumps 17 which was required for the lead frame 20 shown in FIG. 7H.

Further, since the intermediate metal layer 30 will be dissolved, the intermediate metal layer 30 has no effect on the joining ability of the stud bumps 17. Therefore, the intermediate metal layer 30 need not have a multilayered structure formed of a plurality of materials as was required for the semiconductor devices 10A and 10B of the first and second embodiments. This results in the reduction of the number of processes to be implemented and of the cost.

In the following, semiconductor devices of seventh and eighth embodiments of the present invention will be described.

Figure 17:
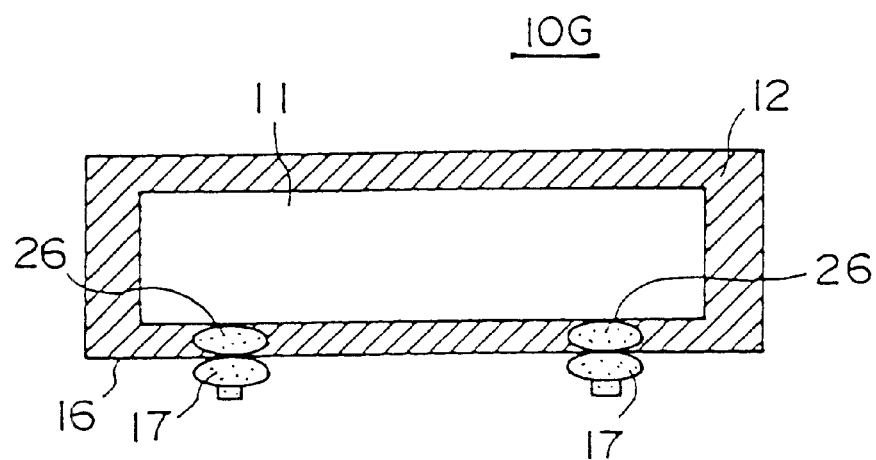
FIG. 17 is a cross-sectional diagram showing a semiconductor device of a seventh embodiment of the present invention.

FIG. 17 shows a semiconductor device 10G of the seventh embodiment of the present invention. The semiconductor device 10G of the present embodiment is characterized in that it has a structure such that the metal layers 13 are removed from the semiconductor device 10D of the fourth embodiment shown in FIG. 11.

Figure 18:
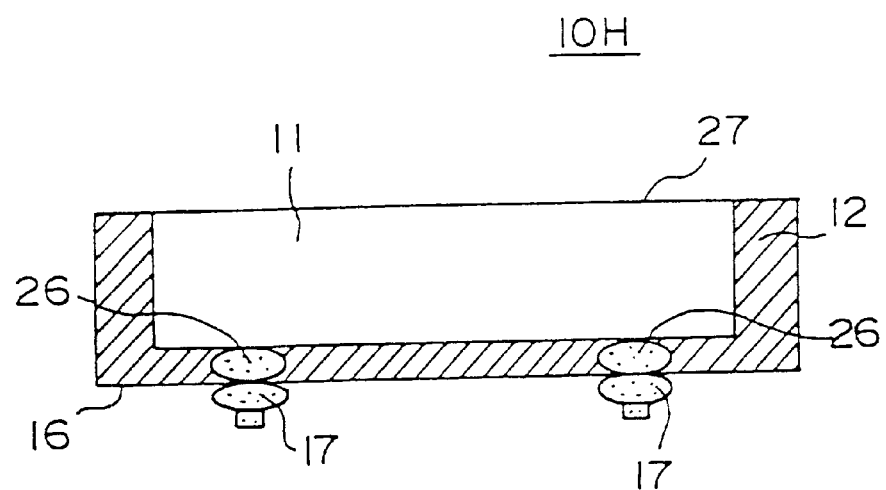
FIG. 18 is a cross-sectional diagram showing a semiconductor device of an eighth embodiment of the present invention.

FIG. 18 shows a semiconductor device 10H of the eighth embodiment of the present invention. The semiconductor device 10H of the present invention is characterized in that it has a structure such that the metal layers 13 are removed from the semiconductor device 10E of the fifth embodiment shown in FIG. 12. That is to say, both the seventh and eighth embodiments are characterized in that the stud bumps 17 which serve as external connection terminals are directly connected to the protruded electrodes 26 formed on the semiconductor chip 11.

Also, the semiconductor devices 10G and 10H can be manufactured by utilizing the method of manufacturing a semiconductor device using the intermediate metal layer 30 which method has been described with reference to FIGS. 14 to 16.

With the semiconductor devices 10G and 10H shown in FIGS. 17 and 18, the semiconductor chip 11 is flip-chip mounted on the stud bumps 17 using the protruded electrodes 26, so that there is no need for the wires 18 and the space required for providing the wires is no longer required. Thus, the semiconductor devices 10G and 10H can be reduced in their sizes and thicknesses. Notably, with the semiconductor device 10H, the resin package 12 is polished on the surface (upper surface in the figure) opposite to the mounting-side surface 16, so as to provide the polished surface 27 where the upper surface of the semiconductor chip 11 is exposed. Thereby, it is possible to achieve a further low-back structure of the semiconductor device 10H. Also, since a part of the semiconductor chip 11 is exposed at the polishing surface 27, heat generated at the semiconductor chip 11 can be dissipated efficiently, so that a heat dissipation characteristic is improved.

In the following, a semiconductor device of a ninth embodiment of the present invention will be described.

Figure 19:
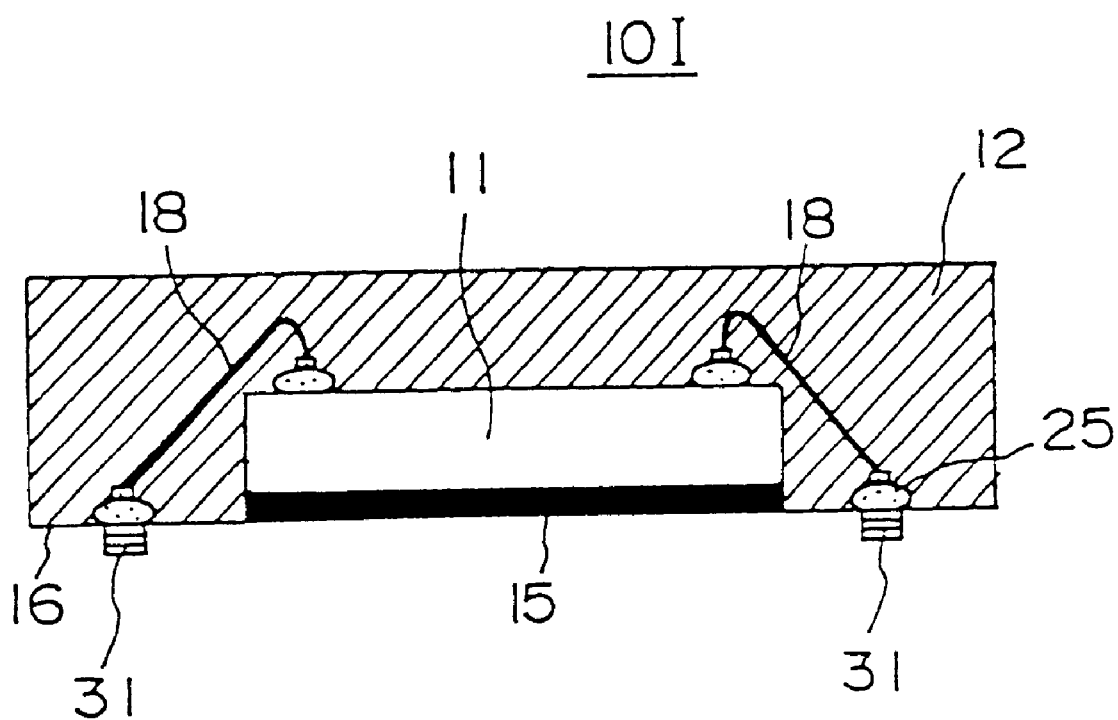
FIG. 19 is a cross-sectional diagram showing a semiconductor device of a ninth embodiment the present invention.

FIG. 19 shows a semiconductor device 10I of the ninth embodiment of the present invention. In the semiconductor device 10F of the sixth embodiment shown in FIG. 13, the internal stud bumps 25 are provided with stud bumps 17 which serve as external connection terminals. However, the present embodiment is characterized in that it has a structure such that the internal stud bumps 25 are provided with external plating layers 31. The external plating layers 31 can be made of solder.

The semiconductor device 10I having the above-described structure can be manufactured by implementing the dissolving process described with reference to FIG. 16 and then implementing an external plating layer forming process instead of the stud bump forming process. The external plating layers 31 are formed by, for example, implementing solder plating on the internal stud bumps 25 exposed from the resin package 12 due to the dissolving process.

In the present embodiment, the external plating layers 31 which serve as external connection terminals can be formed by plating which is efficient and less time-consuming.

In other words, with the semiconductor device 10F of the sixth embodiment (see FIG. 13) it was necessary to form the stud bumps 17 on each of the plurality of internal stud bumps 25 exposed from the resin package 12 using the wire-bonding equipment. However, by providing as the external connection terminals the external plating layers 31 as in the present embodiment, it is possible to provide the external plating layers 31 on the internal stud bumps 25 simultaneously. Accordingly, the external plating layers 31 may be formed efficiently on a plurality of fine internal stud bumps 25.

Referring to FIGS. 20 to 22, the semiconductor devices 10A to 10I of the above-described embodiments will be described with regards to mounting structures for mounting onto a mounting board 33.

Figure 20A:
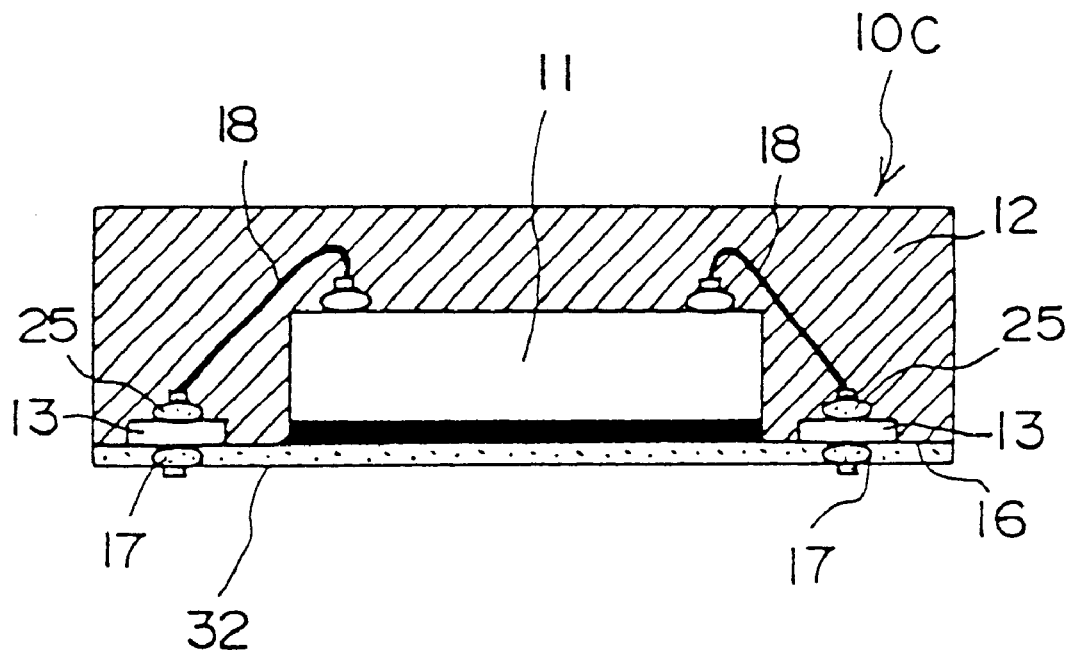
FIGS. 20A and 20B are diagrams showing mounting structures of first and second embodiments of the present invention, respectively.
Figure 20B:
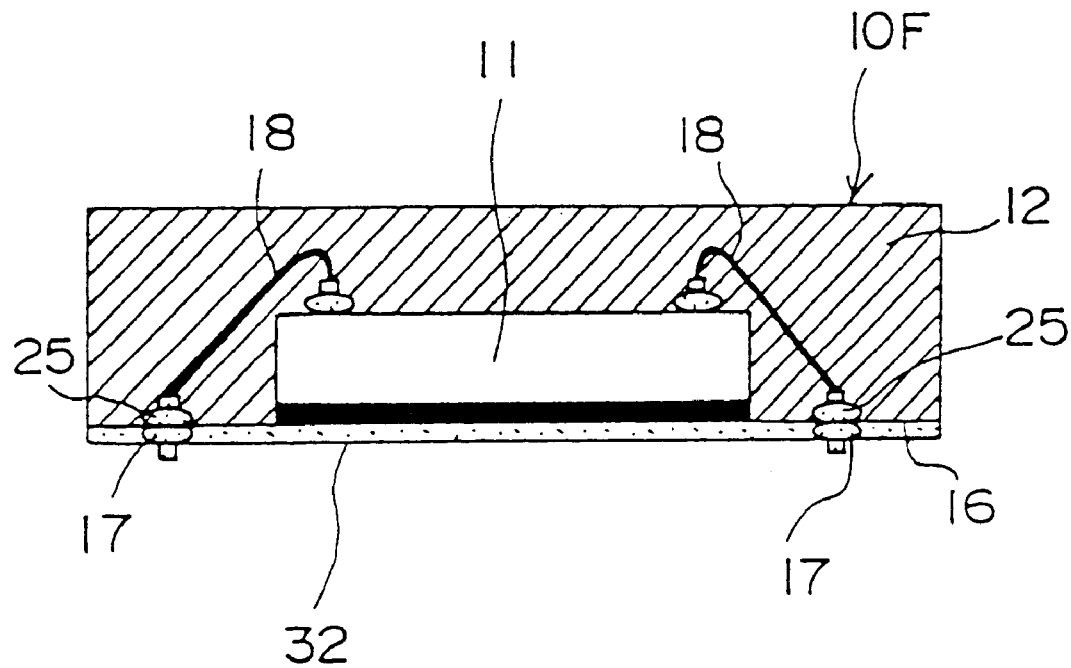
Figure 21A:
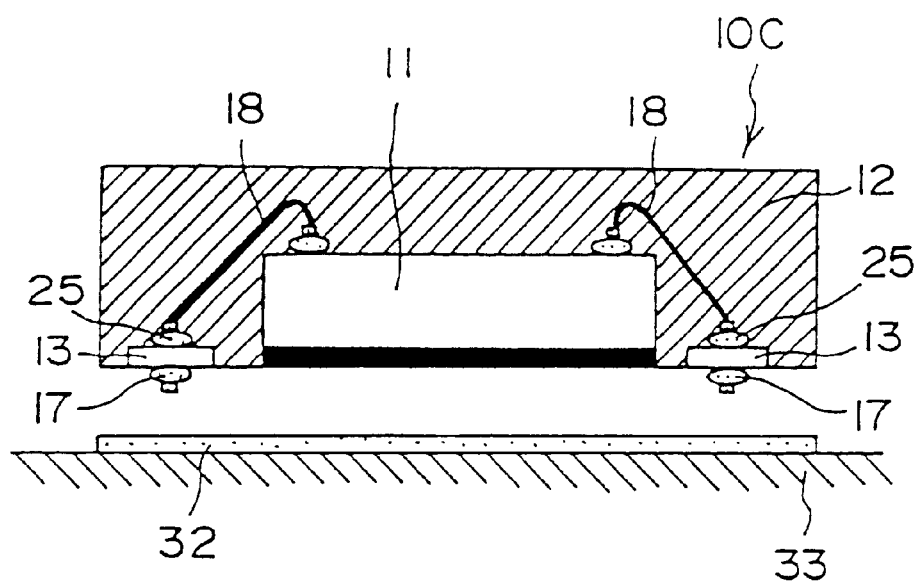
FIGS. 21A and 21B are diagrams showing mounting structures of third and fourth embodiments of the present invention, respectively.
Figure 21B:
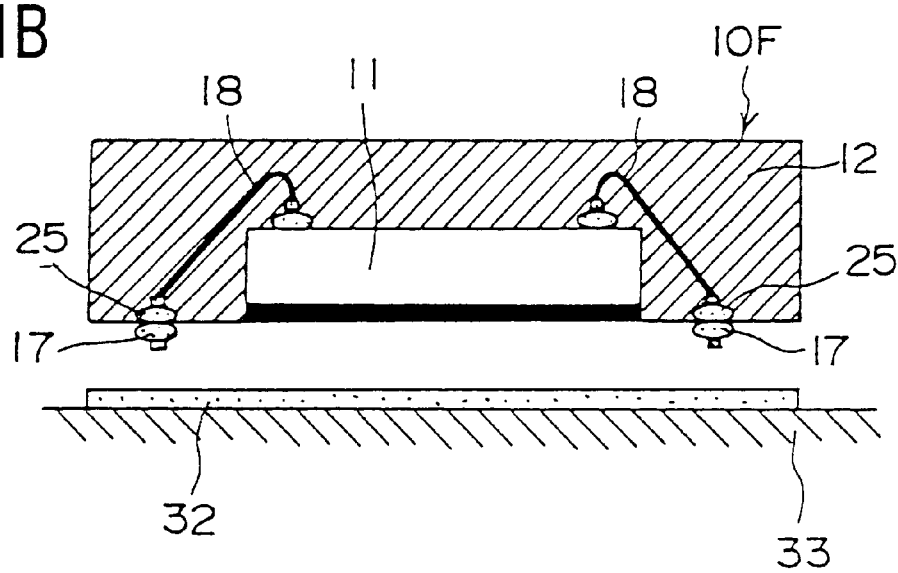
Figure 22A:
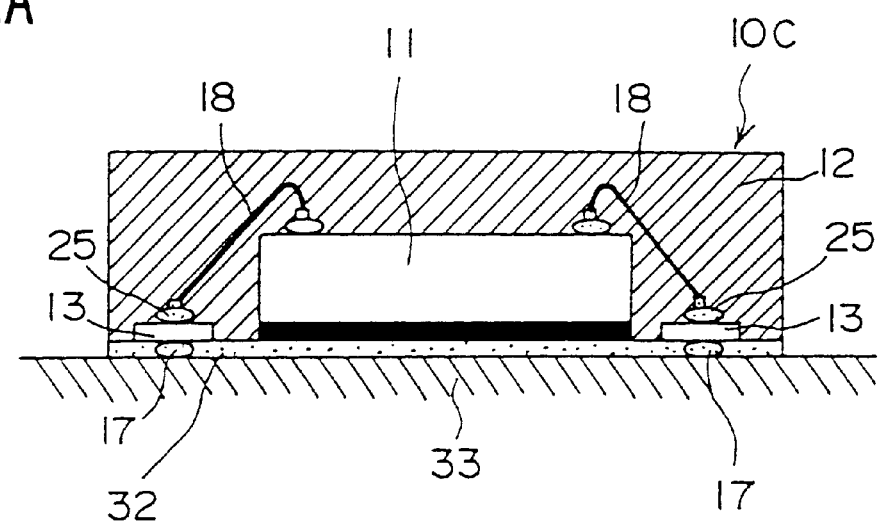
FIGS. 22A and 22B are diagrams showing mounting states of the semiconductor devices.
Figure 22B:
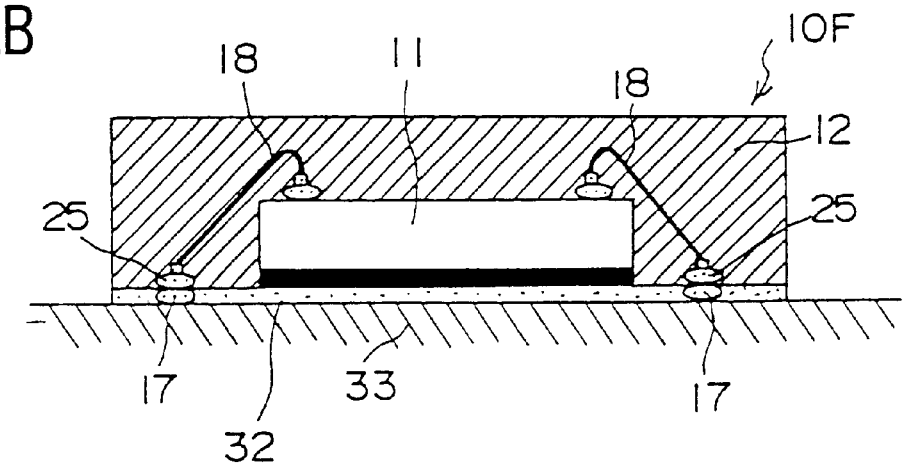

Also, in the following description of the mounting structures, the semiconductor device 10C of the third embodiment and the semiconductor device 10F of the sixth embodiment are taken as examples. FIGS. 20A, 21A and 22A are diagrams showing mounting structures and a mounting state of the semiconductor device 10C and FIGS. 20B, 21B and 22B are diagrams showing mounting structures and a mounting state of the semiconductor device 10F. FIGS. 20A and 20B are diagrams showing mounting structures of first and second embodiments of the present invention, respectively. FIGS. 21A and 21B are diagrams showing mounting structures of third and fourth embodiments of the present invention, respectively. Finally, FIGS. 22A and 22B are diagrams showing mounting states.

As shown in the Figures, the present embodiment is characterized in that an under-fill resin 32 is provided between the mounting-side surface 16 and the mounting board 33 upon mounting the semiconductor device 10C, 10F on the mounting board 33. The under-fill resin 32 is, for example, made of thermosetting resin and is provided for improving the joining force between the semiconductor device 10C, 10F and the mounting board 33.

As described above, the semiconductor device 10C, 10F is provided with the stud bumps 17 serving as external terminals. Thereby, the external terminals will be fine pitched and the joining area between the stud bumps 17 and the mounting board 33 will also be reduced. In the semiconductor device 110 shown in FIG. 3, it was not necessary to provide an under-fill resin since the area of the metal layers 113 were comparatively large and therefore, when the semiconductor device 110 was mounted, the joining force between the metal layers 113 and the mounting board was strong.

However, the semiconductor device 10C, 10F of the present invention is provided with the stud bumps 17 having a fine structure. Therefore, the joining force between the stud bumps 17 and the mounting board 33 is not capable of maintaining a sufficient joining force between the semiconductor device 10C, 10F and the mounting board 33.

Therefore, as shown in FIGS. 22A and 22B, in the mounting structures of the present embodiment, the thermosetting under-fill resin 32 is provided between the semiconductor device 10C, 10F and the mounting board 33. The semiconductor device 10C, 10F and the mounting board 33 are joined together by the joining force exerted by the under-fill resin 32. With such a structure, it is possible to provide the stud bumps 17 serving as external connection terminals with a high density and to improve a joining ability between the semiconductor device 10C, 10F and the mounting board 33.

Also, the under-fill resin 32 can be provided by one of the two methods described below. With the first method as shown in FIGS. 20A and 20B, the under-fill resin 32 is provided on the mounting-side surface 16 of the semiconductor device 10C, 10F prior to mounting the semiconductor device 10C, 10F on the mounting board 33. Also, with the second method as shown in FIGS. 21A and 21B, the under-fill resin 32 is provided on the mounting board 33 prior to mounting the semiconductor device 10C, 10F on the mounting board 33.

With either method, when the semiconductor device 10C, 10F is mounted on the mounting board, the under-fill resin 32 will be provided between the semiconductor device 10C, 10F and the mounting board 33. Accordingly, it is possible to improve the joining ability between the semiconductor device 10C, 10F and the mounting board 33.

Figure 23:
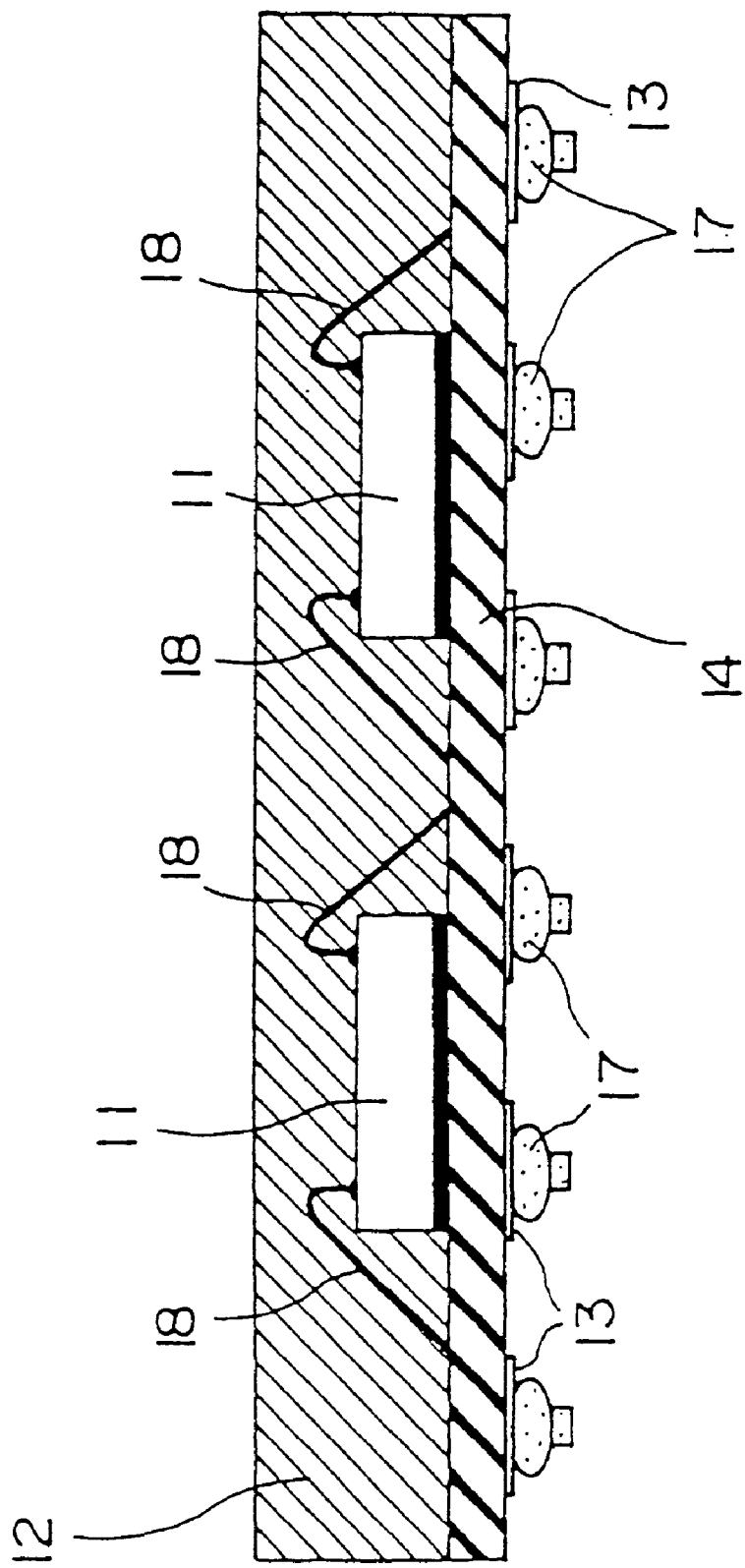
FIG. 23 is a cross-sectional diagram showing a semiconductor device module of a first embodiment constructed by utilizing the structure of the semiconductor device of the first embodiment shown in FIG. 4.
Figure 24:
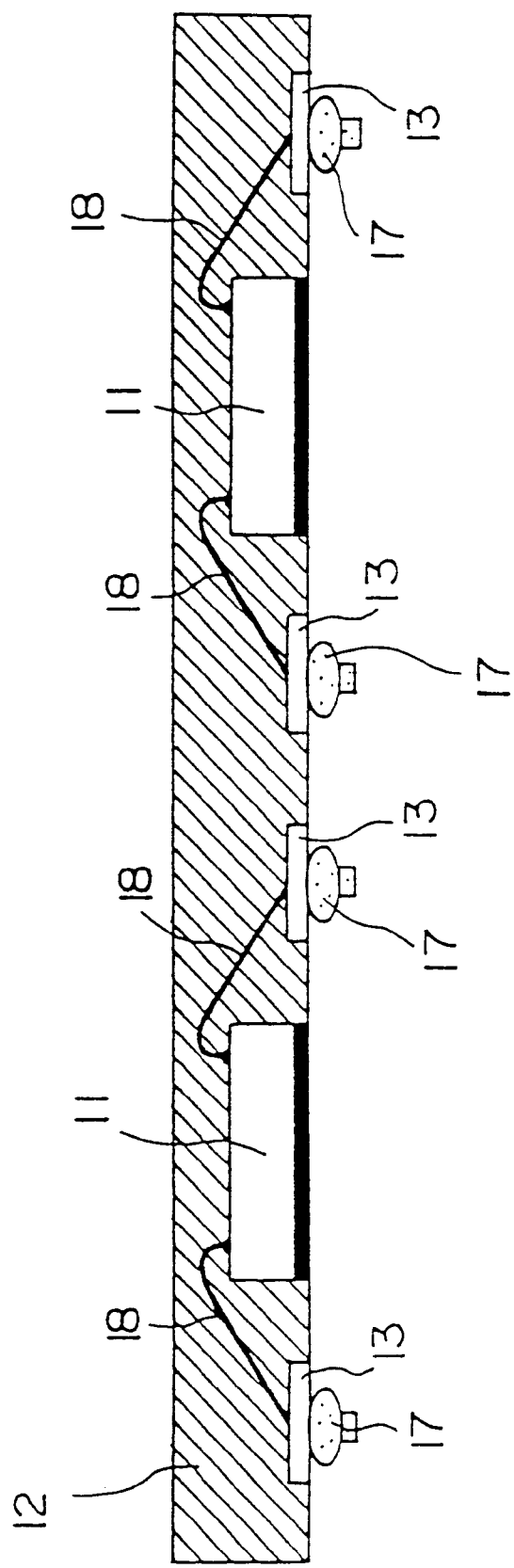
FIG. 24 is a cross-sectional diagram showing a semiconductor device module of a second embodiment constructed by utilizing the structure of the semiconductor device of the second embodiment shown in FIG. 5.
Figure 25:
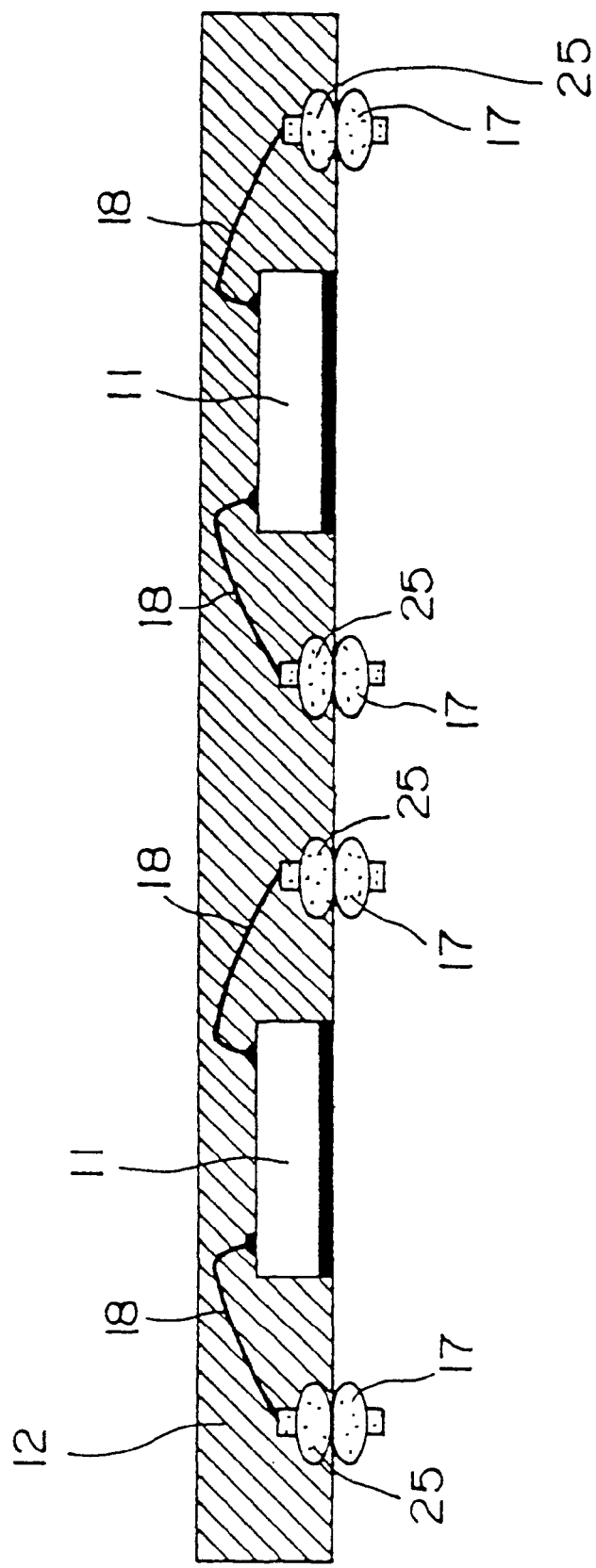
FIG. 25 is a cross-sectional diagram showing a semiconductor device module of a third embodiment constructed by utilizing the structure of the semiconductor device of the sixth embodiment shown in FIG. 13.

FIG. 23 is a diagram showing a semiconductor device module 40A constructed by utilizing the structure of the semiconductor device 10A of the first embodiment shown in FIG. 4. Also, FIG. 24 is a diagram showing a semiconductor device module 40B constructed by utilizing the structure of the semiconductor device 10B of the second embodiment shown in FIG. 5. Finally, FIG. 25 is a diagram showing a semiconductor device module 40C constructed by utilizing the structure of the semiconductor device 10F of the sixth embodiment shown in FIG. 13.

By utilizing the structures of the semiconductor devices of the present invention in constructing the semiconductor device modules 40A to 40C, the same effects as those achieved with the semiconductor devices 10A to 10I can be realized with the semiconductor device modules 40A to 40C. Such effects may be the reduction in sizes and thicknesses of the semiconductor device modules 40A to 40C, fine-pitched external connection terminals and simplification of the manufacturing processes.

Figure 26:
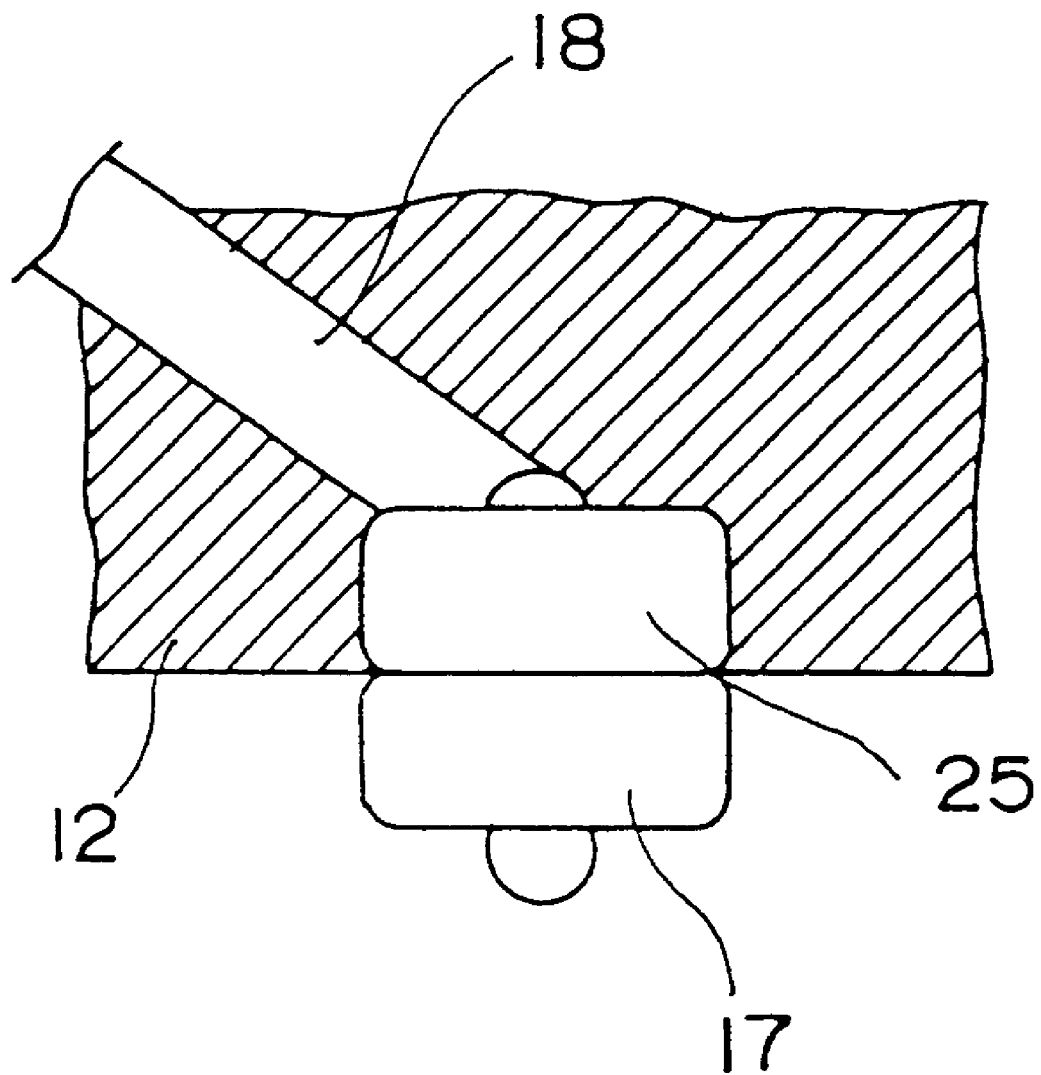
FIG. 26 is an enlarged view of a stud bump of the semiconductor device of the sixth embodiment.

Now, referring to FIGS. 13, 16 and 26, the joining state of the wires 18, the stud bumps 17 and the internal stud bumps 25 of the semiconductor device 10F of the sixth embodiment will be described in detail. FIG. 26 is an enlarged diagram of the stud bump 17 and the internal stud bump 25 of the semiconductor device of the sixth embodiment.

Referring again to FIGS. 14 to 16, manufacturing processes of the semiconductor device 10F of the sixth embodiment will be described. In the chip mounting process, the semiconductor chip 11 is mounted on the lead frame 20 provided with the intermediate metal layer 30. Also, the internal stud bumps 25 are formed on the intermediate metal layer 30 at a predetermined position where the stud bumps 17 will be formed at. Then, using a wire bonder, the wires 18 are provided between the electrode pads 28 provided on the semiconductor chip 11 and the internal stud bumps 25 provided on the intermediate metal layer 30.

When providing the wires 18, with the semiconductor device 10F of the sixth embodiment, a normal bonding method is implemented. In the normal bonding method, first, the wires 18 are bonded on the electrode pads 28 of the semiconductor chip 11 (first bonding), and then the wires 18 are extended and bonded on the internal stud bumps 25 (second bonding).

After providing the wires 18, the resin package 12 is formed in the sealing process and the lead frame 20 is removed in the dissolving process. Then, the stud-bump forming process is performed so that the stud bumps 17 which serve as external connection terminals will be formed on the internal stud bumps 25 exposed from the resin package 12.

In order to form the stud bump 17, as has been described with reference to FIG. 9, first, a ball-shaped part is formed by spark discharging a gold wire extending out in a downward direction from the tip of a capillary 24. Then, the capillary 24 is vertically moved downwards and vibrated at an ultrasound frequency, so that the ball-shaped part is welded on the internal stud bumps 25. Subsequently, the capillary 24 is moved vertically upwards, so as to pull and cut the gold wire. Thus, the stud bump 17 can be formed on the internal stud bump 25. FIG. 26 is an enlarged diagram showing the vicinity of the thus formed stud bump 17.

In an experiment carried out by the inventor, it is found that, although very rare, the internal stud bumps 25 may fall off from the resin package 12 while forming the stud bumps 17 using the method described above. This will be described below.

In order to hold the internal stud bumps 25 on the resin package 12, two forces may be considered. One is a joining force (F1) between the internal stud bumps 25 and the resin package 12 and the other is a joining force (F2) between the internal stud bumps 25 and the wires 18. Also, the force causing the internal stud bumps 25 to fall off from the resin package 12 is a pulling force (F3) applied to cut the gold wire. Therefore, it is understood that the internal stud bumps 25 will fall off from the resin package 12 in a case where F3>F1+F2. Accordingly, in order to prevent the internal stud bumps 25 from falling off the resin package 12, it is necessary to increase the joining force F1 and the joining force F2.

However, when the wires 18 are second bonded on the internal stud bumps 25, the second bonding will be implemented by stitch bonding. Therefore, the joining force (F2)

between the internal stud bumps 25 and the wires 18 will be smaller compared to that of the first bonding side. Also, the volume of a bonding part is smaller on the second bonding side, so that the joining force (F1) between the internal stud bumps 25 and the resin package 12 is also smaller. From the above reasons, it is considered that the internal stud bumps 25 may fall off from the resin package 12 upon forming the stud bumps 17.

In the following, a semiconductor device of a tenth embodiment of the present invention will be described.

Figure 27:
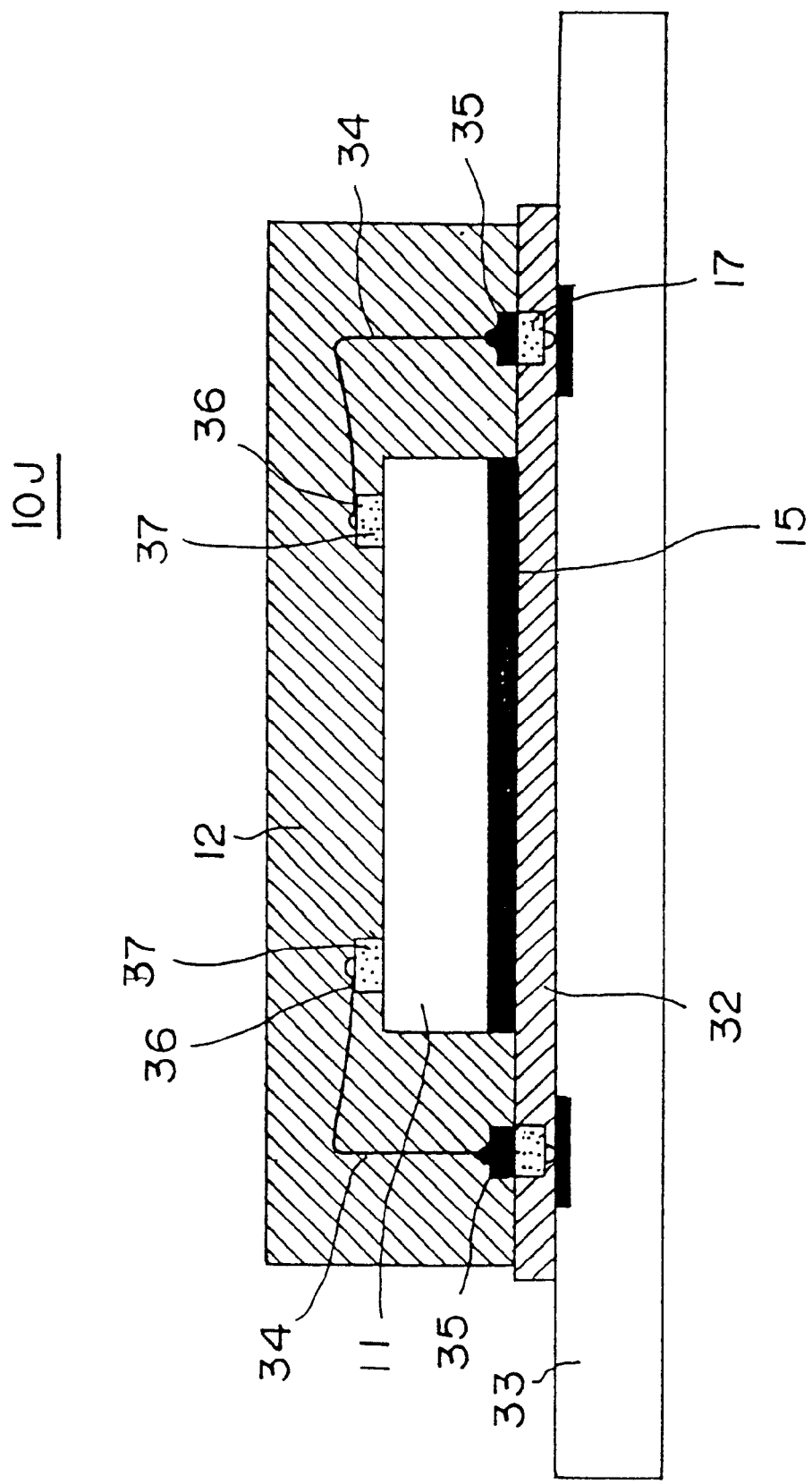
FIG. 27 is a cross-sectional diagram showing a tenth embodiment of a semiconductor device according to the present invention.

FIG. 27 is a diagram showing a semiconductor device 10J of the tenth embodiment being mounted on the mounting board provided with the under-fill resin 32. The semiconductor device 10J of the present embodiment is constructed such that the first bonding parts 35 are prevented from falling off from the resin package 12 upon forming the stud bumps 17.

The semiconductor device 10J of the present embodiment is characterized in that the wires 34 extend from the stud bumps 17 and terminate at electrode stud bumps 37 provided on the electrode pads 28. There fore, with the structure of the present embodiment, each of the wires 34 has a first bonding end (first bonding part 35) which is a mounting-side end to be joined to the stud bump 17 and a second bonding end (second bonding part 36) which will be joined to the electrode stud bump 37.

The electrode stud bumps 37 are formed on the electrode pads 28 because the second bonding which may be stitch bonding cannot be directly implemented on the electrode pad 28 of the semiconductor chip 11.

In order to manufacture the semiconductor device 10J of the above structure, first, in the chip mounting process, the first bonding parts 35 are formed by first bonding the wires 34 on the intermediate metal layer 30 formed on the lead frame 20. Then, the second bonding parts 36 are formed by extending the wires 34 towards the electrode stud bumps 37 formed on the semiconductor chip 11 and then second bonding the wires 34 on the electrode stud bumps 37. In the following text, this bonding method will be referred to as a reverse bonding method. Also, processes other than the chip mounting process (sealing process, dissolving process, stud-bump forming process and external plating layer forming process) are the same as those of the above-described embodiments.

By utilizing the above-described manufacturing method, the first bonding part 35 whereto the stud bumps 17 are joined is formed by nail head bonding and the second bonding part 36 joined to the semiconductor chip 11 is formed by stitch bonding.

The nail head bonding gives a bonding part having a greater volume compared to the volume provided by stitch bonding. Therefore, by using the reverse bonding method in the chip mounting process, the joining force (F1) between the first bonding part 35 (mounting-side end) and the resin package 12 will be increased.

Now, the joining force (F2) between the first bonding part 35 and the wire 34 will be considered. It is noted that the first bonding part 35 formed by nail head bonding is provided with the wire 34 connected thereto in an integrated manner. Thus, compared to a structure where the wires 18 are stitch bonded on the internal stud bumps 25, the joining force (F2) between the first bonding parts 35 and the wires 34 is greater.

As described above, according to the structure of the present embodiment, the joining force (F1) between the first bonding parts 35 (mounting-side end) and the resin package 12 and the joining force (F2) between the first bonding parts 35 and the wires 34 are both greater than those of the structure shown in FIG. 26.

Therefore, even if the gold wire is pulled after the stud bumps 17 are formed in the stud bump forming process, the first bonding parts 35 are prevented from falling off from the resin package 12 since the first bonding parts 35 are securely held in the resin package 12. Thereby, a manufacturing yield of the semiconductor device may be improved.

Also, wire loops formed by reverse bonding have a lower height than those formed by normal bonding. Accordingly, the semiconductor 10J may be reduced in thickness since the height of the wires 34 is reduced.

When the external plating layers 31 are utilized as in the ninth embodiment described with reference to FIG. 19, there will be no problem related to falling off of the internal stud bumps 25. However, the present embodiment may be applied to the semiconductor using the external plating layers 31 as external connection terminals so as to achieve further reduction of the thickness of the semiconductor device.

Also, the wires 34 and the stud bumps 17 used in the present embodiment can be made of metal such as gold (Au), palladium (Pd) and solder.

Figure 28:
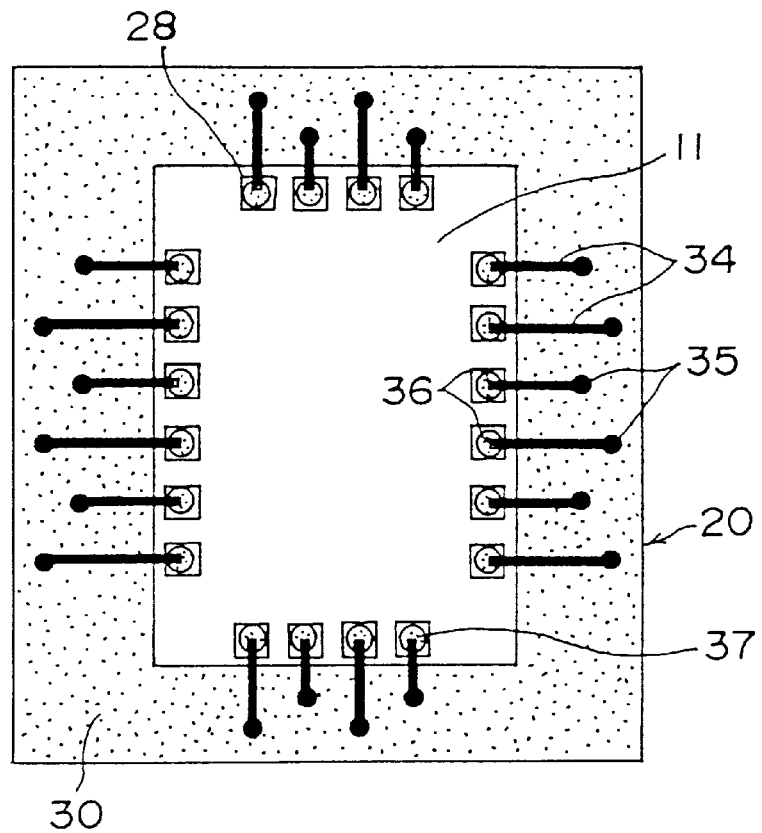
FIG. 28 is a plan view showing a variant of the tenth embodiment of the semiconductor device according to the present invention.

Referring to FIG. 28, a first variant of the semiconductor device 10J of the above-described tenth embodiment will be described. The first variant is characterized in that the first bonding parts 35 are bonded on the intermediate metal layer 30 at two alternating positions from the second bonding parts 36.

Figure 29:
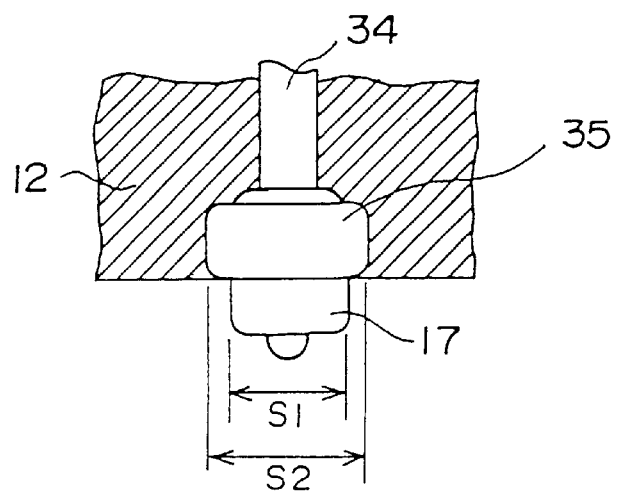
FIG. 29 is an enlarged view of a stud bump of the semiconductor device shown in FIG. 28.

In the above-described structure formed by reverse bonding, the volume of the bonding part is greater, so that an area S2 whereon the stud bump 17 is to be joined becomes greater as shown in FIG. 29. When such first bonding parts 35 having greater areas S2 are positioned in a straight line, it is not possible to form the first bonding parts 35 with a narrow pitch (i.e., high density). Also, when forming the first bonding part 35, a certain space is required for the capillary. With regard to the space for the capillary, a high-density structure cannot be achieved when the first bonding parts 35 are positioned in a straight line.

However, by providing the first bonding parts 35 with two alternating positions as in the present variant, the pitches between neighboring first bonding parts 35 can be reduced. This may result in a structure such that the first bonding parts 35 are provided with high density. Thus, it is possible to achieve a semiconductor device with a reduced size and an increased number of terminals. Also, even with such a high-density structure, when forming a first bonding part 35, it is prevented that the capillary interferes with another first bonding part 35 already formed.

FIG. 29 is also a diagram showing a second variant of the semiconductor device 10J of the tenth embodiment. The present embodiment is characterized in that the area S2 of the first bonding part exposed from the resin package 12 is provided so as to be greater than a joining area S1 of the stud bump 17.

With the present embodiment, it is possible to join the stud bumps 17 on the first bonding parts 35 even when the positions of the stud bumps 17 are slightly varied.

Therefore, when automatically forming the stud bumps 17 using the wire-bonding equipment, the stud bumps 17 can be securely joined on the first bonding parts 35 since slight errors of bonding positions do not affect the joining of the stud bumps 17 and the first bonding parts 35. Thereby, it is possible to achieve an improvement of the reliability by preventing bad connections between the first bonding parts 35 and the stud bumps 17. Also, it is also possible to achieve a higher efficiency in forming the stud bumps 17.

Figure 30:
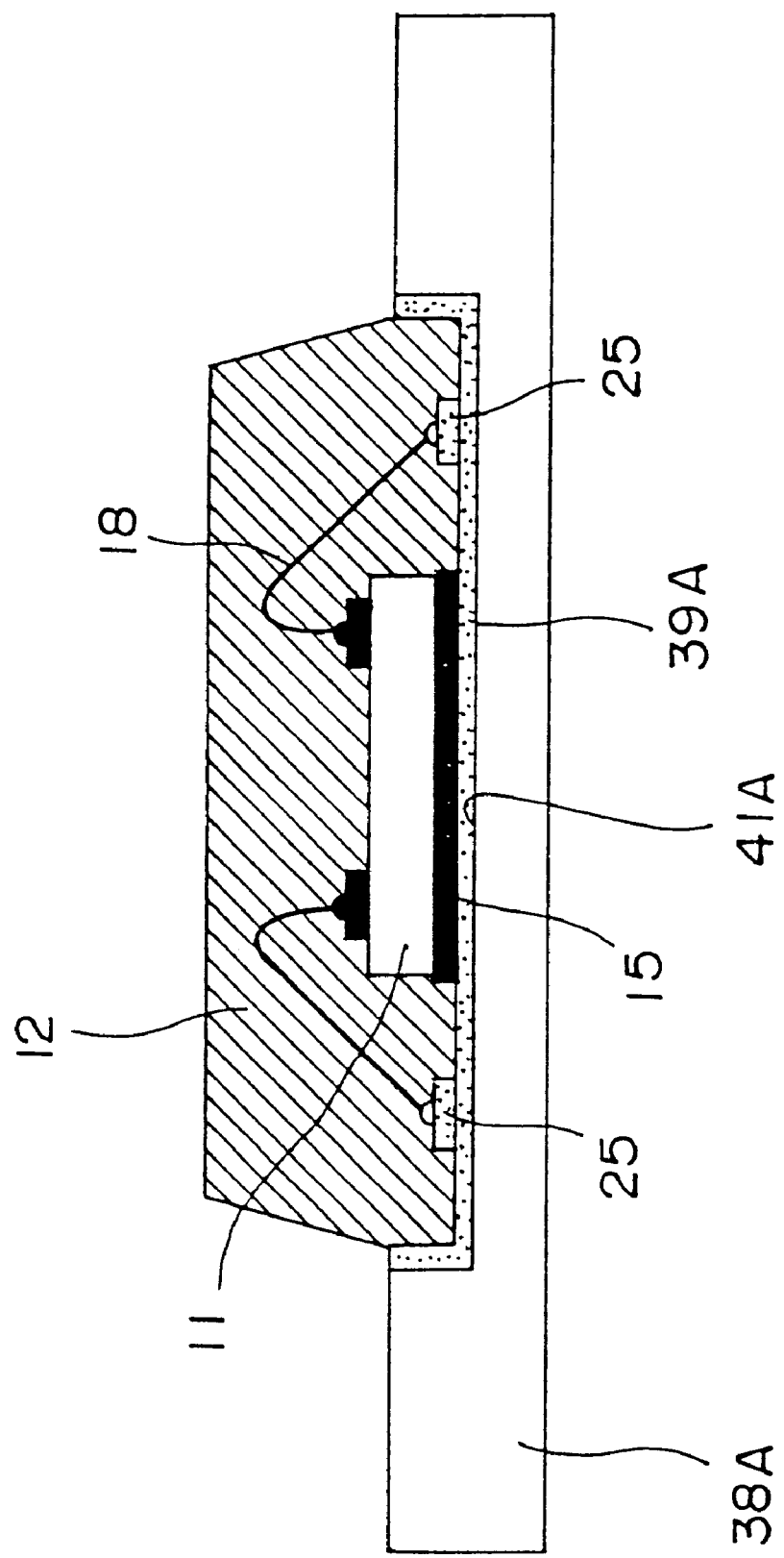
FIG. 30 is a cross-sectional diagram showing a third embodiment of a method of manufacturing a semiconductor device, particularly a sealing process.

Referring to FIG. 30, a third embodiment of the method of manufacturing a semiconductor device will be described. The processes common to those of the first embodiment of the method of manufacturing the semiconductor device 10B described with reference to FIGS. 7A to 7H, 8 and 9 are not described in detail. This also applies to each of the embodiments of the method of manufacturing the semiconductor device described below.

FIG. 30 is cross-sectional diagram showing a lead frame 38A after the sealing process. As shown in the Figure, the present embodiment is characterized in that the lead frame 38A is provided with a recess 41A (hereinafter referred to as a cavity) formed at a position corresponding to a position where the resin package 12 is formed.

The cavity 41A is formed by, for example, in manufacturing processes of the lead frame, implementing half etching on the metal base material 21 (see FIG. 7A). Also, in the present embodiment, an intermediate metal layer 39A is provided on an entire surface of the cavity 41A.

Using the lead frame 38A whereon the cavity 41A is formed at the position where the resin package 12 is formed, the yield of manufacturing the semiconductor device may be improved. This will be described in the following.

With the methods of manufacturing a semiconductor device of the first and second embodiments, the lead frame 20 in the shape of a flat board without a cavity is used. In the sealing process, the resin package 12 is provided on the lead frame 20 having the shape of a flat board. The lead frame 20 is made of copper or copper alloy, and there is provided the intermediate metal layer 30 (e.g., silver (Ag)) on the surface of the lead frame 20.

When the lead frame 20 has a substantially flat shape, the resin package 12 may peel off from the lead frame 20 together with the intermediate metal layer 30, in a case where the intermediate metal layer 30 is made of a material with bad adhesiveness against the lead frame 20 (e.g., silver (Ag)). Then, maintenance is necessary for returning the resin package 12 onto the lead frame 20, or the peeled resin package 12 will be discarded. Thereby, the yield of manufacturing the semiconductor device will be reduced.

On the contrary, as in the present embodiment, the lead frame 38A is provided with the cavity 41A at the position where the resin package 12 is formed. Therefore, the resin package 12 is formed such that a part of the resin package 12 will be embedded in the cavity 41A of the lead frame 38A as shown in FIG. 30.

Thus, an anchoring effect occurs at a part of the resin package 12 embedded in the cavity 41A. This prevents the resin package 12 from peeling off from the lead frame 38A. Accordingly, the above-described maintenance will be unnecessary. Also, since a chance of producing bad quality product is reduced, it is possible to achieve an improvement in the yield of manufacturing the semiconductor device.

Figure 31:
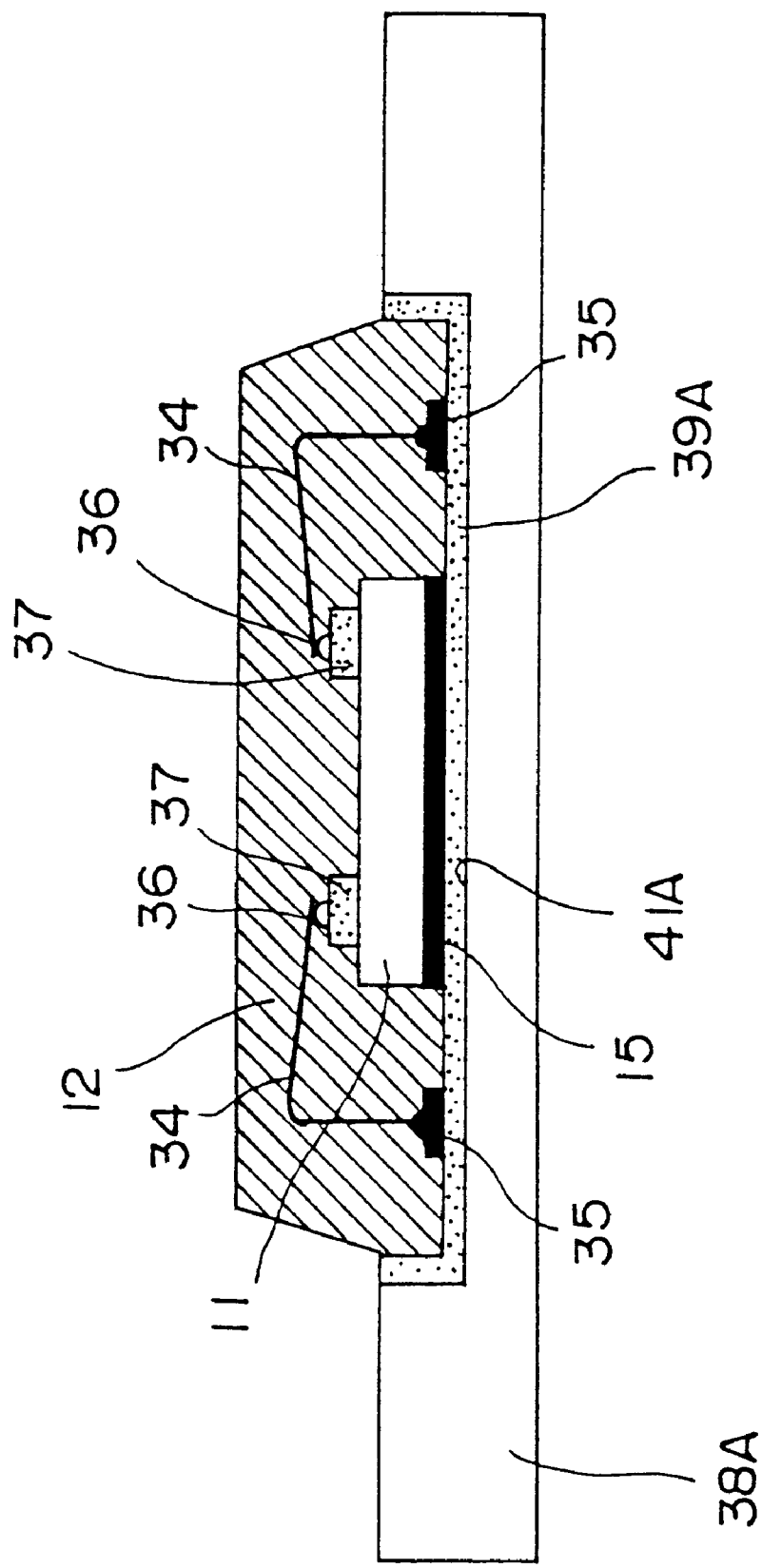
FIG. 31 is cross sectional a diagram showing a variant of the third embodiment of the method of manufacturing a semiconductor device.

Also, in the embodiment shown in FIG. 30, the wires 18 are formed by normal bonding. However, the present embodiment is not limited to a structure where the wires 18 are formed by normal bonding but can be applied to a structure where the wires 34 are formed by reverse bonding as a variant shown in FIG. 31.

Figure 32:
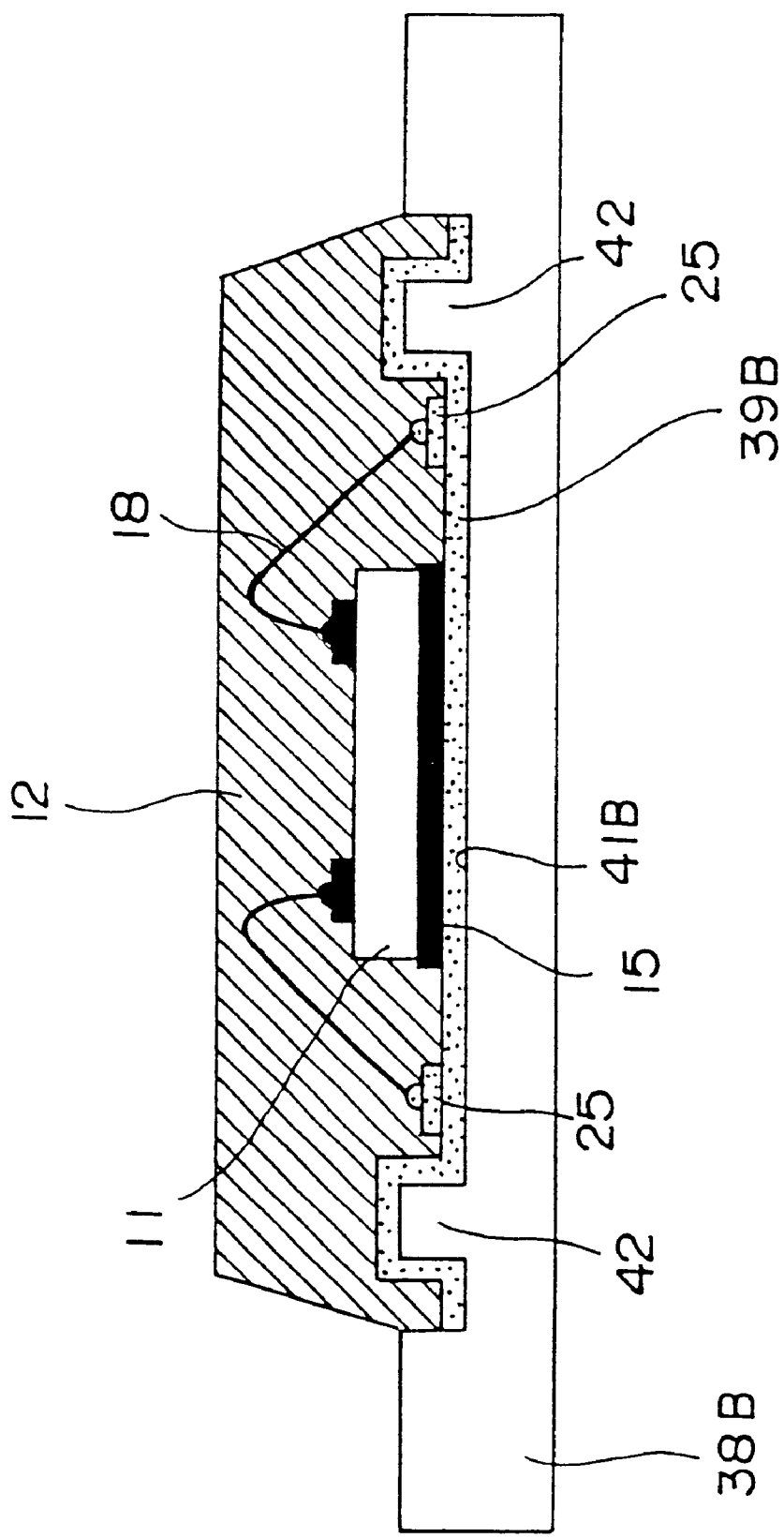
FIG. 32 is a cross-sectional diagram showing a fourth embodiment of a method of manufacturing a semiconductor device, particularly a sealing process.

Referring to FIG. 32, a fourth embodiment of the method of manufacturing a semiconductor device will be described.

FIG. 32 is cross-sectional diagram showing a lead frame 38B after the sealing process. As shown in the Figure, as in the third embodiment, the lead frame 38B is provided with a recess 41B (hereinafter referred to as a cavity) formed at a position corresponding to a position where the resin package 12 is formed. Further, the present embodiment is characterized in that raised parts 42 are formed in the cavity 41B.

The cavity 41B and the raised parts 42 are formed by, for example, in manufacturing processes of the lead frame, implementing half etching on the metal base material 21 (see FIG. 7A) with a mask provided at positions corresponding to the recessed parts. Also, in the present embodiment, an intermediate metal layer 39B is provided on an entire surface of the cavity 41A including the raised parts 42.

With the above-described structure, the joining area between the resin package 12 and the lead frame 38B increases when the resin package 12 is embedded in the cavity 41B of the lead frame 38B. This results in a stronger anchoring effect. Accordingly, the resin package 12 is positively prevented from peeling off from the lead frame 38B, so that the yield of manufacturing the semiconductor device is improved.

Also, when wire bonding the wires 34 in the chip mounting process, the raised parts 42 can be used as marks for automatic recognition by the wire-bonding equipment. Thus, when wire bonding the wires 34, a higher positioning accuracy is achieved and it is possible to improve a producing capacity and a reliability of the semiconductor device to be manufactured.

Figure 33:
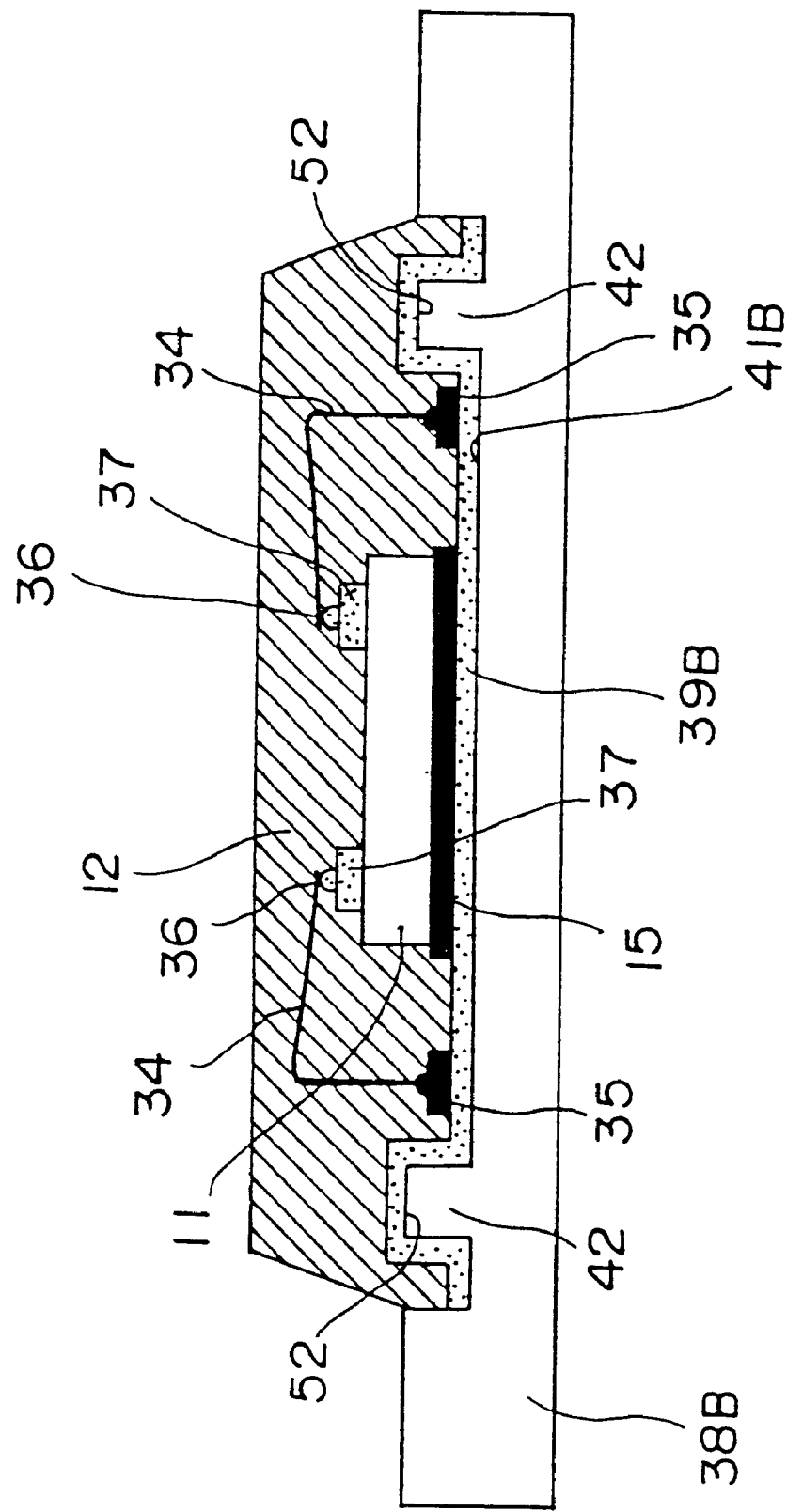
FIG. 33 is a cross-sectional diagram showing a variant of the fourth embodiment of the method of manufacturing a semiconductor device.
Figure 34:
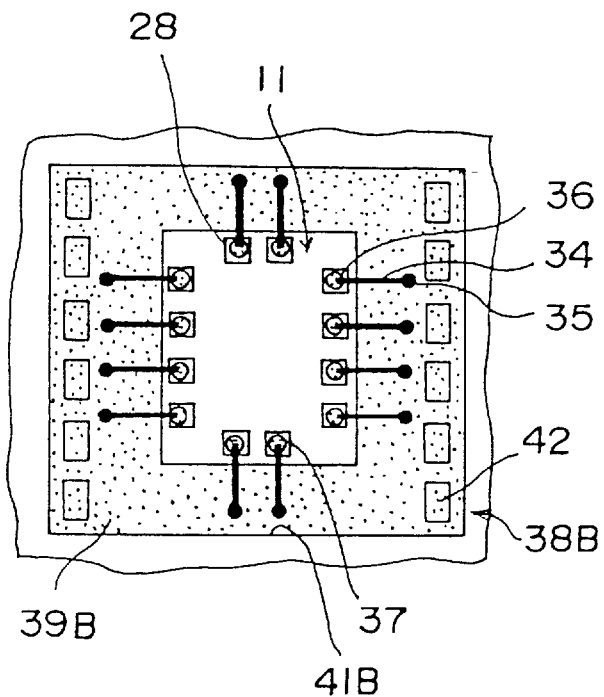
FIG. 34 is a plan view showing a variant of the fourth embodiment of the method of manufacturing a semiconductor device.

Also, in the embodiment shown in FIG. 32, the wires 18 are provided by normal bonding. However, the present embodiment is not limited to a structure where the wires 18 are formed by normal bonding but can be applied to a structure where the wires 34 are formed by reverse bonding as a variant shown in FIGS. 33 and 34.

Figure 35:
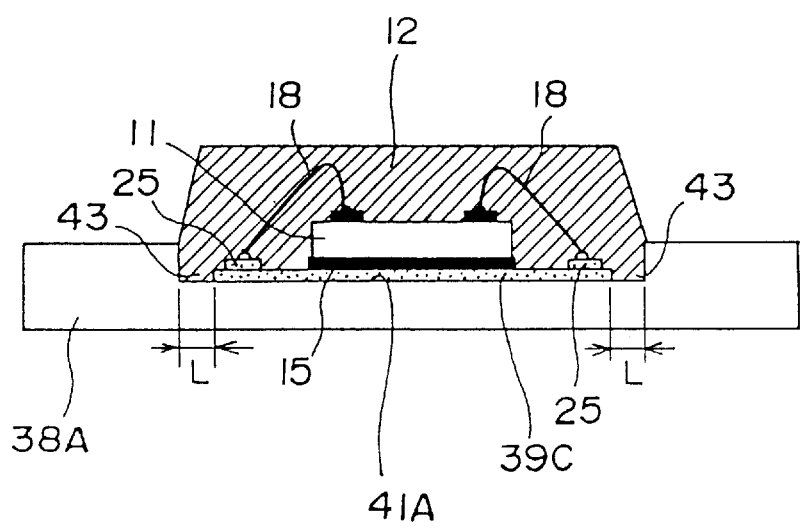
FIG. 35 is a cross-sectional diagram showing a fifth embodiment of a method of manufacturing a semiconductor device, particularly a sealing process.

Referring to FIG. 35, a fifth embodiment of the method of manufacturing a semiconductor device will be described.

FIG. 35 is a cross-sectional diagram showing the lead frame 38A after the sealing process. As shown in the Figure, as in the third and fourth embodiments of the method of manufacturing a semiconductor device, the lead frame 38A is provided with a recess 41A (hereinafter referred to as a cavity) formed at a position corresponding to a position where the resin package 12 is formed. The cavity 41A is the same as that of the third embodiment described with reference to FIG. 30.

In the third and fourth embodiments of the method of manufacturing a semiconductor device, the intermediate metal layers 39A, 39B are formed on entire surfaces of the cavity 41A, 41B. However, in the present embodiment, the cavity 41A has an area, at least at the periphery, not provided with an intermediate metal layer 39C (a region indicated by L in the Figure).

Thus, by providing the area having no intermediate metal layer 39C at the periphery of the cavity 41A, the resin package 12 adheres to the lead frame 38A in the region L even when the intermediate metal layer 39C is made of a material having low adhesiveness against the lead frame 38A. Accordingly, the resin package 12 is prevented from peeling off from the lead frame 38B, so that the yield of manufacturing the semiconductor device is improved.

Figure 36:
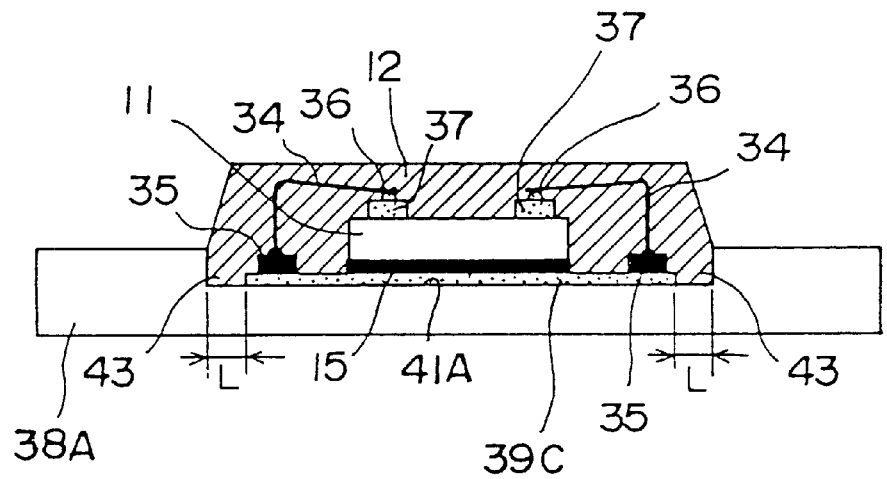
FIG. 36 is a cross-sectional diagram showing a variant of the fifth embodiment of the method of manufacturing a semiconductor device.

Also, in the embodiment shown in FIG. 35, the wires 18 are formed by normal bonding. However, the present embodiment is not limited to a structure where the wires 18 are formed by normal bonding but can be applied to a structure where the wires 34 are formed by reverse bonding as a variant shown in FIG. 36.

Referring to FIGS. 37 to 40, each process of the fifth embodiment of the method of manufacturing a semiconductor device will be described. The following description will be made of an example where the wires 34 are formed by reverse bonding.

Figure 37:
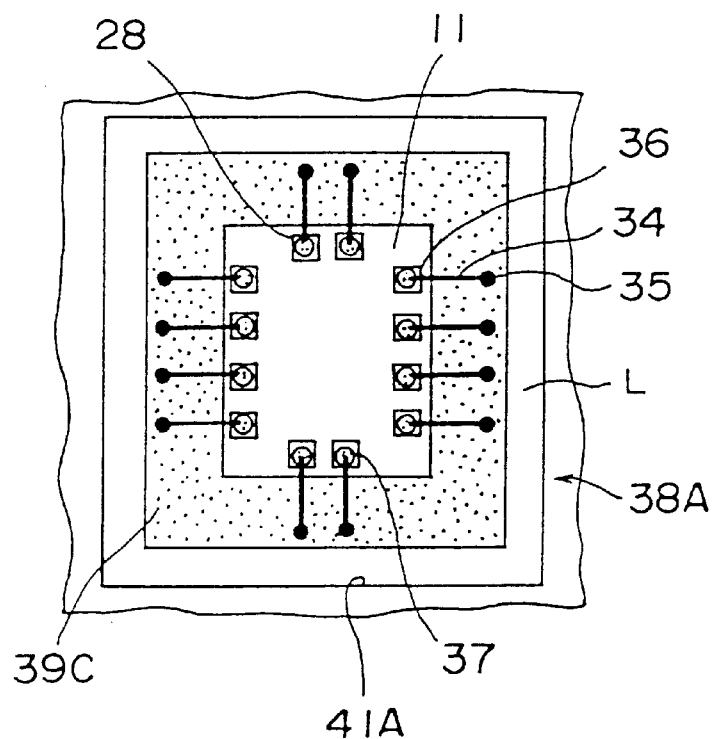
FIG. 37 is a plan view showing a variant of the fifth embodiment of the method of manufacturing a semiconductor device.

FIG. 37 is a plan view showing the lead frame 38A after the chip mounting process. As shown in the Figure, the intermediate metal layer 39C is provided except for the predetermined region L of the cavity 41A. Therefore, the lead frame 38A is exposed in the region L. In the present embodiment, the intermediate metal layer 39C is made of silver (Ag) which has low adhesiveness against the lead frame 38A which is, for example, made of copper (Cu) or copper alloy.

The semiconductor chip 11 is fixed on a predetermined mounting position on the lead frame 38A by the chip fixing resin 15. Also, the intermediate metal layer 39C and the semiconductor chip 11 are connected by wires 34. Since the wires 34 are provided by reverse bonding, the ends of the wires 34 which are joined to the intermediate metal layer 39C are the first bonding parts 35 and the ends of the wires 34 which are joined to the semiconductor chip 11 are the second bonding parts 36.

Figure 38:
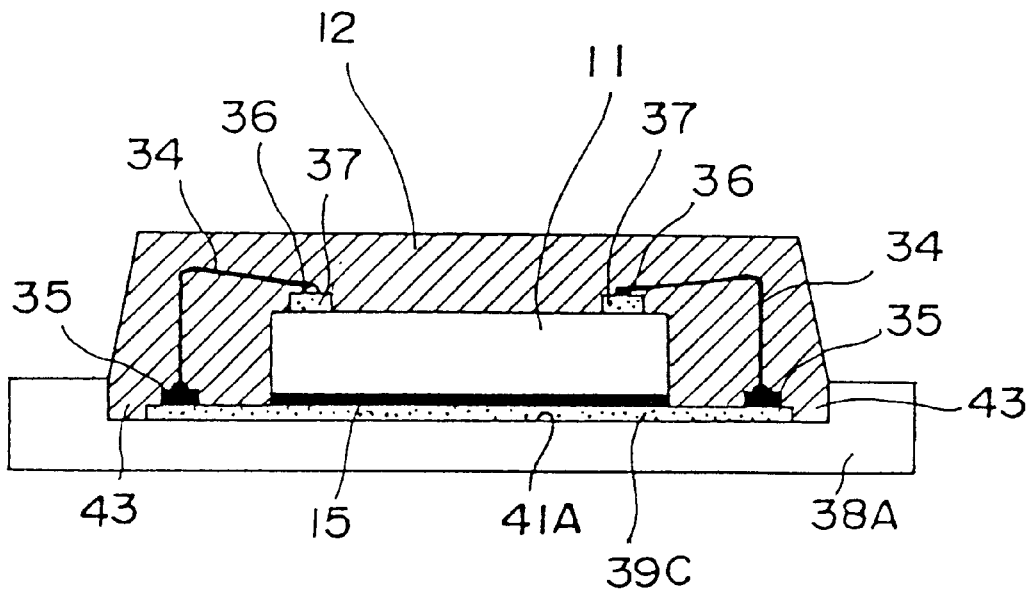
FIGS. 38 and 39 are cross-sectional diagrams showing a variant of the fifth embodiment of the method of manufacturing a semiconductor device.

FIG. 38 is cross-sectional diagram showing the lead frame 38A after the sealing process. By implementing the sealing process, the resin package 12 is formed on the cavity 41A as shown in the Figure. As has been described, at the periphery of the cavity 41, there is formed the region L where no intermediate metal layer 39C is formed. Therefore, in this region L, the resin package 12 and the lead frame 38A are directly joined.

There is a good adhesiveness between the resin package 12 and the lead frame 38A. Therefore, the resin package 12 and the lead frame 38A are securely joined together by an anchoring effect caused by the resin package 12 embedded in the cavity 41A and by an adhesive force in the region L. Thus, the resin package 12 will not peel off from the lead frame 38A.

Figure 39:
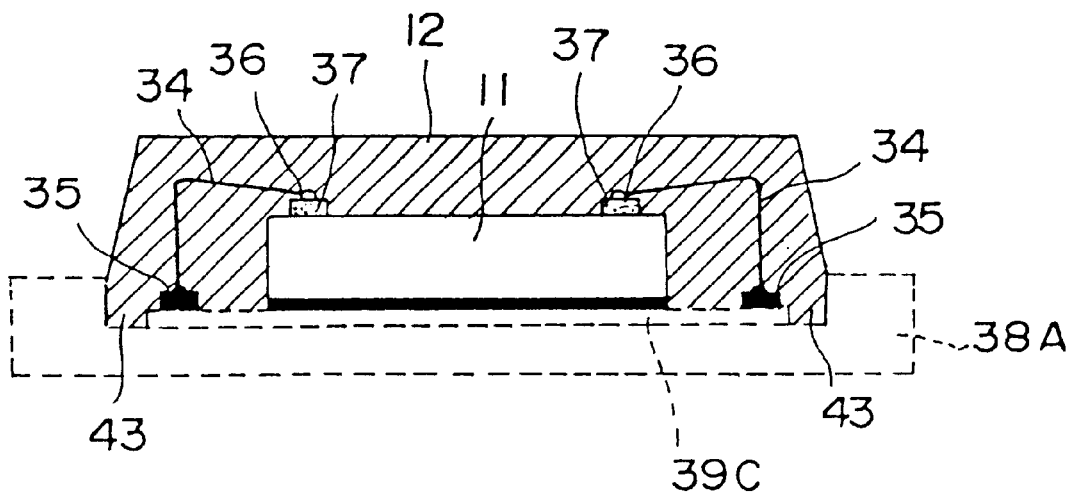

After the chip mounting process and the sealing process, a dissolving process shown in FIG. 39 is implemented. In the dissolving process, the intermediate metal layer 39C is dissolved as well as the lead frame 38A. Then, the first bonding parts 35 are exposed from the resin package 12. Also, when the intermediate metal layers 39C are removed, individual first bonding parts 35 become electrically insulated from one another.

Figure 40:
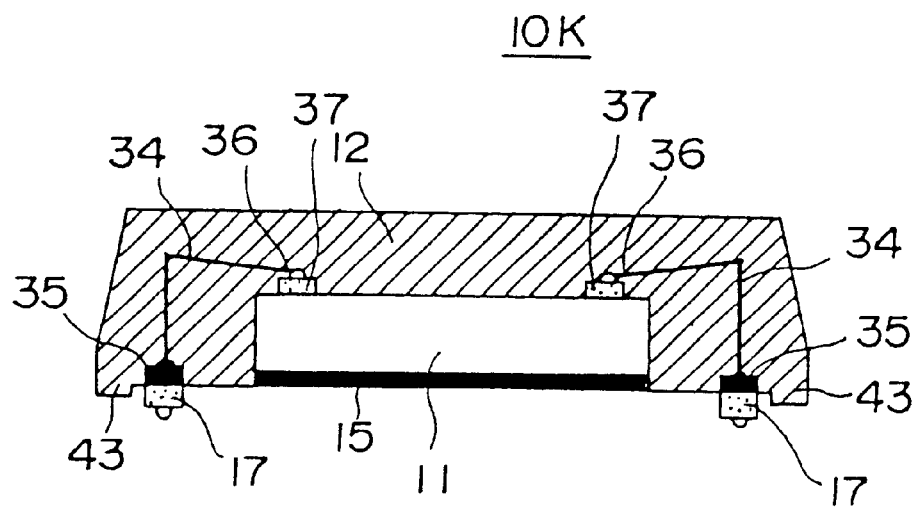
FIG. 40 is a cross-sectional diagram showing an eleventh embodiment of a semiconductor device according to the present invention.

After the dissolving process, a stud bump forming process is implemented. The stud bumps 17 serving as the external connection terminals are formed on the first bonding parts 35 exposed from the resin package 12 using the wire-bonding equipment. Thus, the semiconductor device 10K shown in FIG. 40 is manufactured by implementing the series of manufacturing processes described above. This semiconductor device 10K has a structure such that protruded parts 43 are formed on the base material part which will be the mounting surface.

Figure 41:
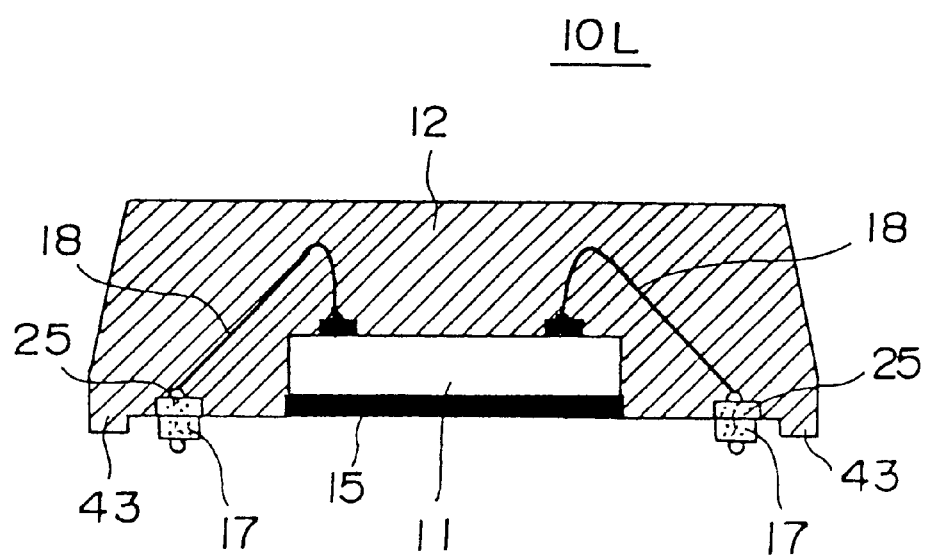
FIG. 41 is a cross-sectional diagram showing a twelfth embodiment of a semiconductor device according to the present invention.

In the above-described embodiment, the wires 34 are provided by reverse bonding. However, the above-described method of manufacturing can be applied when normal bonding is used. The semiconductor device 10L shown in FIG. 41 is manufactured by applying the above-described method of manufacturing to normal bonding.

Also, each embodiment described using FIGS. 35 to 41 has been described as a structure having the region where no intermediate metal layer 39C is provided only at the periphery of the cavity 41A. However, as in the second to fifth embodiments described above, the present embodiment can be applied to the semiconductor devices 10B to 10E provided with the metal layers 13.

With the structures of the semiconductor devices 10B to 10E of the second to fifth embodiments, the area of the metal layers 13 formed on the lead frame 20 in the sealing process is smaller. However, when the metal layers 13 are made of metal which tends to peel off from the lead frame 20, though not with high probability, there is still a possibility that the resin package 12 peels off. Thus, by applying the present embodiment to the semiconductor devices 10B to 10E of the second to fifth embodiments, the resin package 12 is prevented from peeling off.

Figure 42:
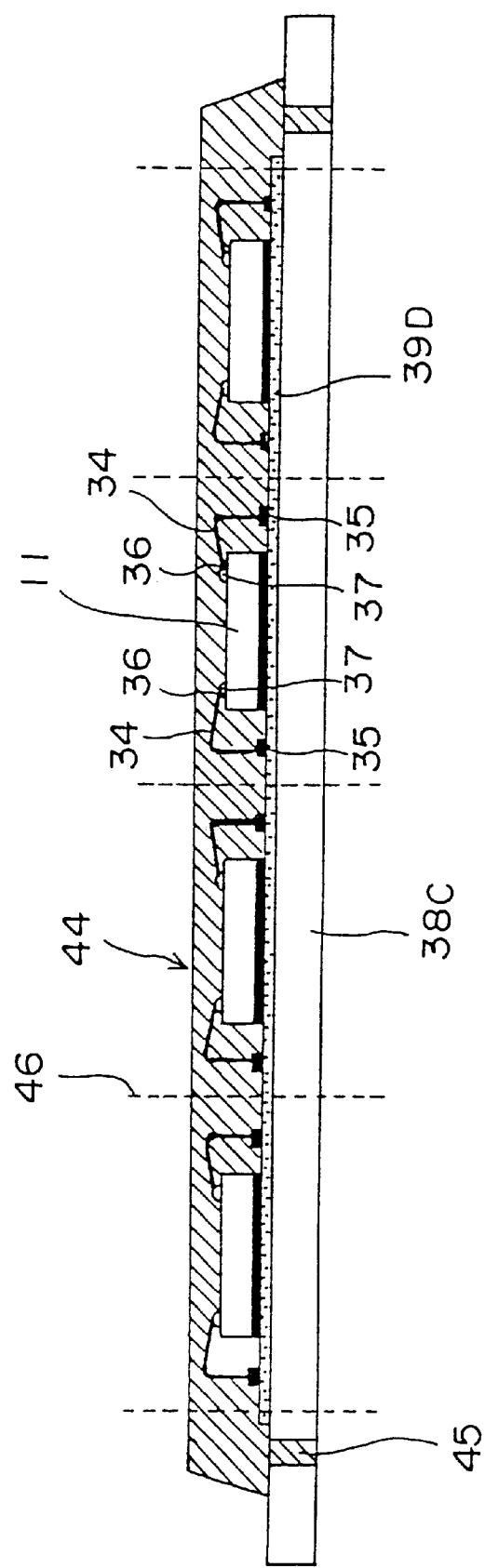
FIG. 42 is a cross-sectional diagram showing a sixth embodiment of a method of manufacturing a semiconductor device, particularly a sealing process.

Referring to FIG. 42, a sixth embodiment of the method of manufacturing a semiconductor device will be described.

FIG. 42 is cross-sectional diagram showing a lead frame 38C after the sealing process. The present embodiment shows a method of manufacturing a plurality of semiconductor devices from a single lead frame 38C (a so-called multiple forming).

The lead frame 38C is provided with a plurality of semiconductor chips 11 mounted thereon. Also, in regards to improving producing capability, an intermediate metal layer 39D is formed on substantially entire surface of the lead frame 38C. A mold resin 44 (which will be divided into resin packages 12) is formed as a single piece covering a plurality of semiconductor devices 11. The lead frame 38C is not provided with individual cavities.

With a structure for implementing multiple forming, when an intermediate metal layer 39D is made of a material having low adhesiveness against the lead frame 38C, the mold resin 44 may peel off from the lead frame 38C. The damage resulting from this peeling is particularly great in a case of such multiple forming.

Thus, in the present embodiment, the lead frame 38C is provided with through holes 45. The through holes 45 are placed at positions apart from the area where the semiconductor chips are provided. Accordingly, when the mold resin is formed in the sealing process, this resin which serves as the mold resin 44 will also be filled in the through holes 45.

The resin filled in the through holes 45 will give an anchoring effect which fixes the mold resin 44 on the lead frame 38C. Therefore, an adhesiveness between the mold resin 44 and the lead frame 38C improves, so that the mold resin 44 is prevented from peeling off from the lead frame 38C.

After the sealing process, a dissolving process is implemented for simultaneously removing the lead frame 38C and the intermediate metal layer 39D. After the dissolving process, the plurality of the semiconductor chips 11 is connected by the mold resin 44. Therefore, subsequently, the mold resin 44 is divided into individual pieces at division lines 46 shown by dashed lines in FIG. 42 (dividing process).

Then, a stud-bump forming process is implemented to the individual pieces. Thus, the semiconductor devices are manufactured. Also, the above-described dividing process and the stud-bump forming process may be implemented in a reversed order. That is to say, first, the stud-bump forming process may be implemented so as to form stud bumps, and then the dividing process may be implemented so as to divide the mold resin 44 into individual pieces.

Figure 43:
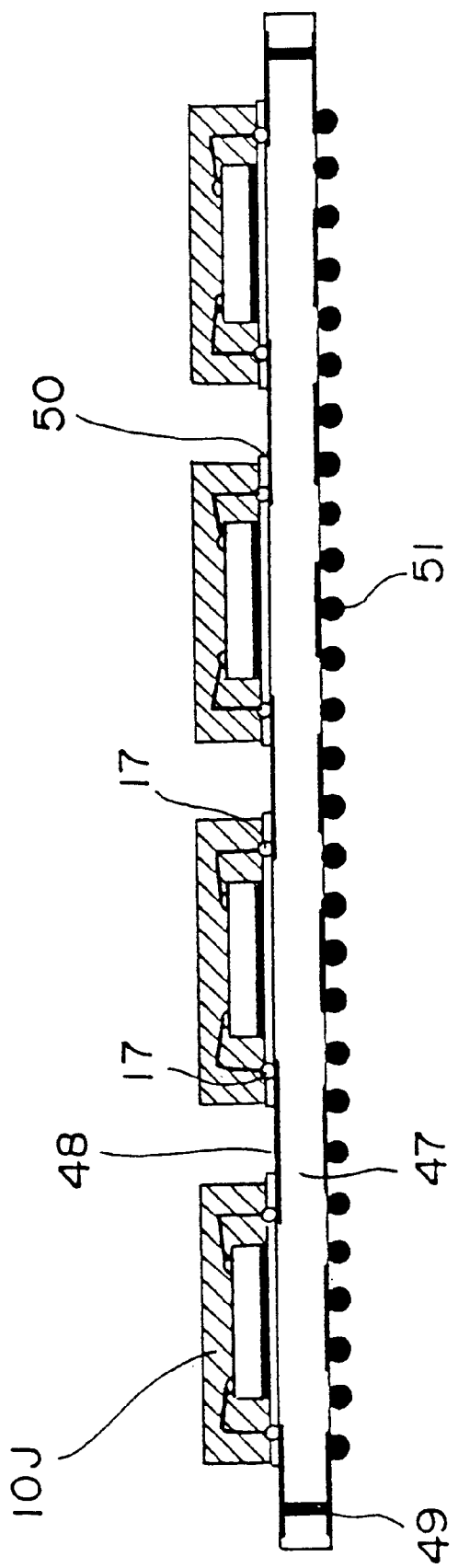
FIG. 43 is a cross-sectional diagram showing a fourth embodiment of a semiconductor device module according to the present invention.

FIG. 43 is a diagram showing a semiconductor device module 40D formed by mounting a plurality of semiconductor devices 10J of the tenth embodiment shown in FIG. 27 on a single mounting board 47.

Individual semiconductor devices 10J are electrically connected to each other by interconnections 48 formed on the mounting board 47. Also, an under-fill resin 50 is provided between each semiconductor device 10J and the mounting board 47, so that the stud bumps 17 are not subjected to excessive stress resulting from thermal changes. Further, each semiconductor device 10J provided on the upper surface of the mounting board 47 is electrically connected to mounting terminals 51 provided on the lower surface of the mounting board 47 by vias 49.

Thus, by using a plurality of semiconductor devices 10J as the semiconductor device module 40D, the individual semiconductor device 10J has the above-described effects. Therefore, the semiconductor module 40D can achieve reduction in size and thickness, narrow-pitched external connection terminals and simplification of the manufacturing processes.

Further, the present invention is not limited to these embodiments, but variations and modifications may be made without departing from the scope of the present invention.

The present application is based on Japanese priority application No. 10-043993 filed on Feb. 25, 1998 and Japanese priority application No. 10-1902011 filed on Jul. 7, 1998 the entire contents of which are hereby incorporated by reference.

What is claimed is:

1. A semiconductor device comprising:

a semiconductor chip; and connecting members for electrically connecting said semiconductor chip and external connection terminals, said connecting members including at least one of an internal stud bump and a metal layer, said semiconductor chip and connecting members being sealed in a resin to form a resin package, wherein said external connection terminals are stud bumps made of gold or gold alloy, and the at least one of the internal stud bump and the metal layer having a portion exposed from the resin package, said portion having an area greater than a joining area of the stud bump, said portion being directly connected to said joining area of the stud bump.

2. A semiconductor device comprising:

a semiconductor chip;

a resin package for sealing said semiconductor chip;

metal layers provided on a mounting-side surface of said resin package in an exposed manner with side surfaces of said metal layers being embedded in said resin package; and connecting members for electrically connecting electrode pads provided on the semiconductor chip and the metal layers, wherein said metal layers are provided with stud bumps on the mounting side, said stud bumps being made of gold or gold alloy and serving as external connection terminals, said metal layers being provided at positions corresponding to the stud bumps and directly connected to said stud bumps.

3. The semiconductor device as claimed in claim 2, wherein each of said metal layers has a single-layered structure and is made of one of gold (Au), palladium (Pd) and aluminum (Al).

4. The semiconductor device as claimed in claim 2, wherein each of said metal layers has a double-layered structure having two layers each made of respective one of gold (Au), palladium (Pd) and aluminum (Al).

5. The semiconductor device as claimed in claim 2, wherein each of said metal layers has a double-layered structure having an outer layer made of palladium (Pd) and an inner layer made of nickel (Ni).

6. The semiconductor device as claimed in claim 2, wherein each of said metal layers has a triple-layered structure having three layers made of either a combination of an outer layer made of palladium (Pd), an intermediate layer made of nickel (Ni) and an inner layer made of palladium (Pd), or a combination of an outer layer made of gold (Au), an intermediate layer made of nickel (Ni) and an inner layer made of palladium (Pd).

7. The semiconductor device as claimed in claim 2, wherein each of said metal layers has a quadruple-layered structure having four layers made of a combination of an outer layer made of palladium (Pd), a first intermediate layer made of nickel (Ni), a second intermediate layer made of palladium (Pd) and an inner layer made of gold (Au).

8. A semiconductor device comprising:

a semiconductor chip;

a resin package for sealing said semiconductor chip; and connecting members having one set of ends connected to electrode pads on said semiconductor chip and the other set of ends exposed from said resin package so as to form mounting-side ends, said connecting members including a wire, wherein said resin package also seals the connecting members, wherein said mounting-side ends exposed from said resin package are provided with stud bumps, said stud bumps serving as external connection terminals, and wherein said mounting-side ends have an area greater than a joining area of the stud bump, said mounting side-ends being directly connected to said joining area of the stud bump.

9. The semiconductor device as claimed in claim 8, wherein the wires extend from the stud bumps and terminate at electrode pads on the semiconductor chip.

\* \* \* \* \*